(12) United States Patent
Fujinaga et al.

(10) Patent No.: US 12,374,598 B2
(45) Date of Patent: Jul. 29, 2025

(54) SEMICONDUCTOR APPARATUS INCLUDING PELTIER ELEMENT

(71) Applicant: SONY SEMICONDUCTOR SOLUTIONS CORPORATION, Kanagawa (JP)

(72) Inventors: Yoichiro Fujinaga, Kanagawa (JP); Masami Suzuki, Kanagawa (JP); Tasuku Ogami, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 452 days.

(21) Appl. No.: 17/757,087

(22) PCT Filed: Oct. 8, 2020

(86) PCT No.: PCT/JP2020/038148
§ 371 (c)(1),
(2) Date: Jun. 9, 2022

(87) PCT Pub. No.: WO2021/124653
PCT Pub. Date: Jun. 24, 2021

(65) Prior Publication Data
US 2023/0005813 A1  Jan. 5, 2023

(30) Foreign Application Priority Data
Dec. 19, 2019 (JP) ................. 2019-229289

(51) Int. Cl.
*H01L 23/38* (2006.01)
*H01L 23/00* (2006.01)
*H01L 23/31* (2006.01)

(52) U.S. Cl.
CPC .......... *H01L 23/38* (2013.01); *H01L 23/3114* (2013.01); *H01L 24/08* (2013.01);
(Continued)

(58) Field of Classification Search
CPC ....................................................... H01L 23/38
(Continued)

(56) References Cited

U.S. PATENT DOCUMENTS

2006/0012033 A1  1/2006  Noguchi
2006/0243315 A1  11/2006  Chrysler
(Continued)

FOREIGN PATENT DOCUMENTS

JP    11-289038 A    10/1999
JP    2003-258221 A    9/2003
(Continued)

OTHER PUBLICATIONS

International Search Report and Written Opinion of PCT Application No. PCT/JP2020/038148, issued on Dec. 15, 2020, 09 pages of ISRWO.

*Primary Examiner* — Ajay Arora
(74) *Attorney, Agent, or Firm* — CHIP LAW GROUP

(57) ABSTRACT

Provided with a semiconductor apparatus which is able to be miniaturized and is provided with a Peltier element. The semiconductor apparatus is provided with a semiconductor substrate and the Peltier element which is disposed facing the semiconductor substrate. The Peltier element has a first substrate and a thermoelectric semiconductor which is disposed between the first substrate and the semiconductor substrate. The semiconductor substrate has a first electrode provided on a surface side facing the first substrate. The first substrate has a second electrode provided on a surface side facing the semiconductor substrate. The first electrodes and the second electrodes are each connected to the thermoelectric semiconductor.

9 Claims, 26 Drawing Sheets

(52) U.S. Cl.
CPC .............. *H01L 24/16* (2013.01); *H01L 24/48* (2013.01); *H01L 2224/08113* (2013.01); *H01L 2224/16055* (2013.01); *H01L 2224/48149* (2013.01)

(58) Field of Classification Search
USPC ........................................................ 257/678
See application file for complete search history.

(56) References Cited

U.S. PATENT DOCUMENTS

| | | |
|---|---|---|
| 2009/0072385 A1 | 3/2009 | Alley |
| 2010/0163090 A1* | 7/2010 | Liu .................... H10N 10/17 |
| | | 136/224 |
| 2010/0219525 A1* | 9/2010 | Ibaraki .................. H01L 23/38 |
| | | 257/693 |

FOREIGN PATENT DOCUMENTS

| | | | |
|---|---|---|---|
| JP | 2006-032453 A | | 2/2006 |
| JP | 2019-149501 A | | 9/2019 |
| JP | 2020161763 A | * | 10/2020 |
| WO | 2014/192199 A1 | | 12/2014 |

* cited by examiner

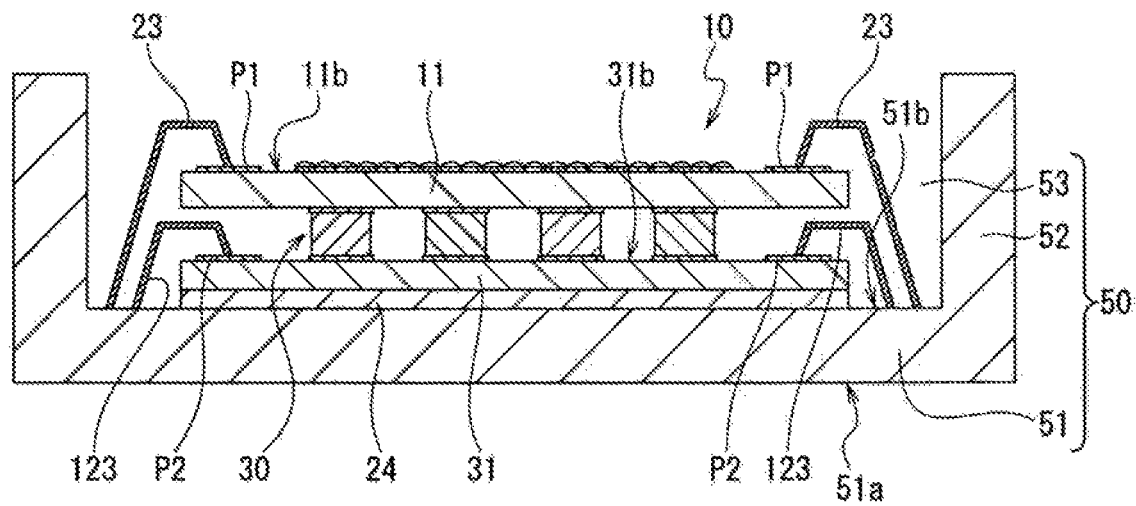
FIG.8C
FIG.8D
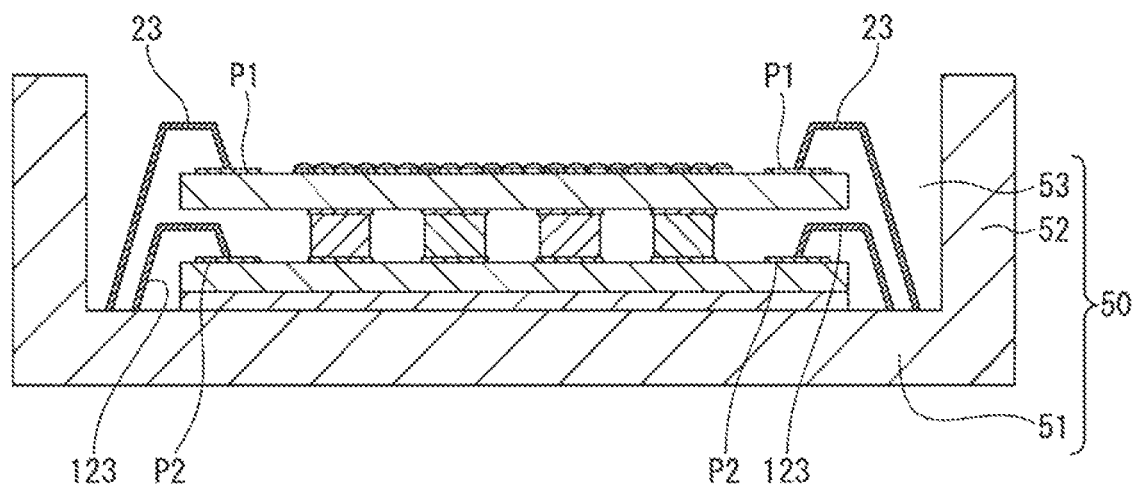

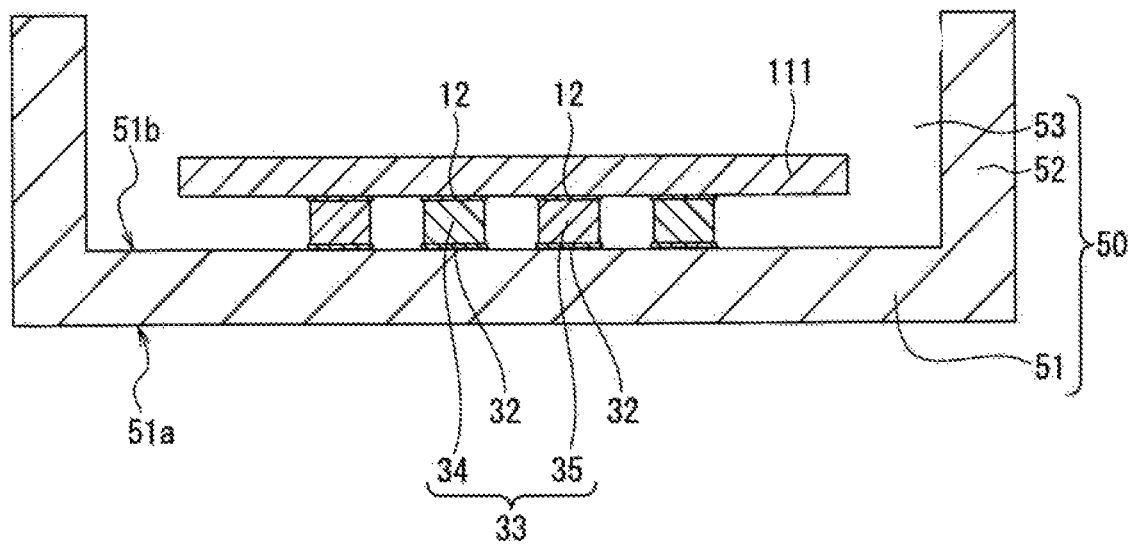
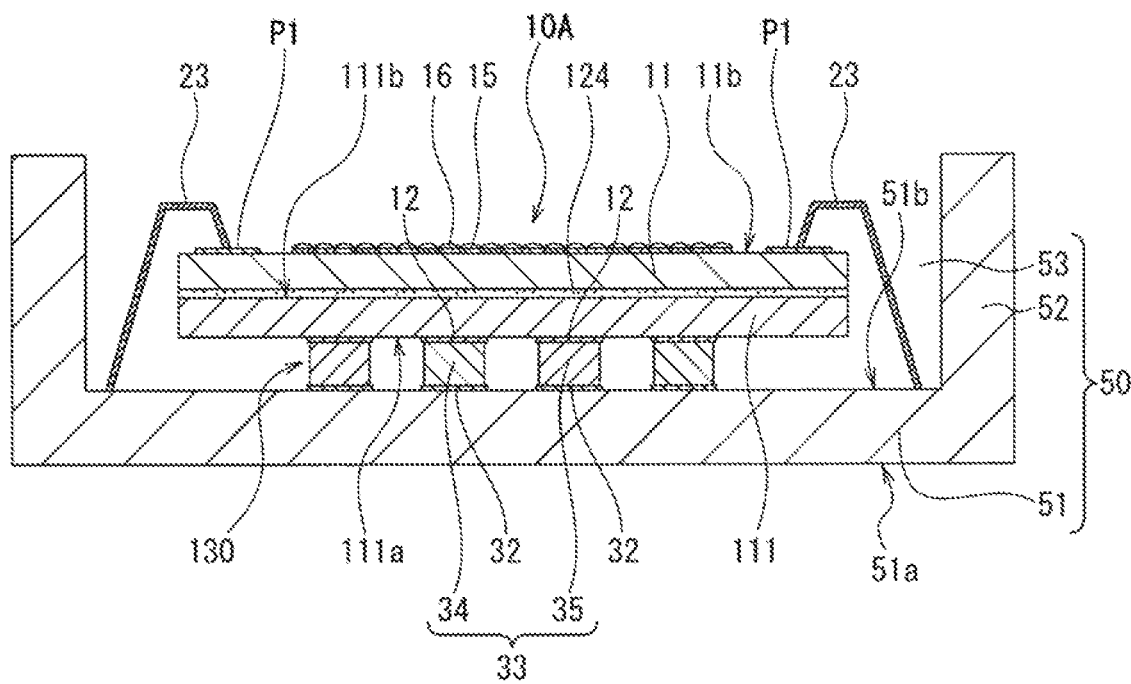

SEMICONDUCTOR APPARATUS INCLUDING PELTIER ELEMENT

CROSS REFERENCE TO RELATED APPLICATIONS

This application is a U.S. National Phase of International Patent Application No. PCT/JP2020/038148 filed on Oct. 8, 2020, which claims priority benefit of Japanese Patent Application No. JP 2019-229289 filed in the Japan Patent Office on Dec. 19, 2019. Each of the above-referenced applications is hereby incorporated herein by reference in its entirety.

TECHNICAL FIELD

The present disclosure relates to a semiconductor apparatus.

BACKGROUND ART

An airtight sealed package incorporating a Peltier element is known as means for cooling a solid-state image capturing element (for example, refer to PTL 1). In the airtight sealed package disclosed in PTL 1, the Peltier element is disposed between the solid-state image capturing element and a protruding section of a base surface.

CITATION LIST

Patent Literature

[PTL 1]
Japanese Patent Laid-Open No. 2003-258221

SUMMARY

Technical Problem

A semiconductor apparatus in which a Peltier element is disposed on one surface side of a solid-state image capturing element, as with the airtight sealed package disclosed in PTL 1, has a great dimension in a thickness direction compared to a semiconductor apparatus in which a Peltier element is not disposed. Reducing the dimension in the thickness direction (referred to below as miniaturization) is desired for a semiconductor apparatus provided with a Peltier element.

The present disclosure is made in the light of such a situation, and an objective of the present disclosure is to provide a semiconductor apparatus which is provided with a Peltier element and can be miniaturized.

Solution to Problem

One aspect of the present disclosure is a semiconductor apparatus including a semiconductor substrate, and a Peltier element disposed facing the semiconductor substrate, in which the Peltier element has a first substrate and a thermoelectric semiconductor disposed between the first substrate and the semiconductor substrate, the semiconductor substrate has a first electrode provided on a surface side facing the first substrate, the first substrate has a second electrode provided on a surface side facing the semiconductor substrate, and the first electrode and the second electrode are each connected to the thermoelectric semiconductor.

As a result, the semiconductor substrate can also serve as a second substrate for the Peltier element (as a substrate disposed sandwiching the thermoelectric semiconductor on a reverse side of the first substrate, that is, as a substrate for, together with the first substrate, sandwiching the thermoelectric semiconductor). It is possible to integrate the Peltier element with the semiconductor substrate, and it is possible to reduce the number of components for the semiconductor apparatus. As a result, it is possible to reduce the thickness (reduce the profile) of the semiconductor apparatus, and it is possible to miniaturize the semiconductor apparatus. In addition, by integrating the semiconductor substrate and the Peltier element, heat exhaust efficiency from the semiconductor substrate to the Peltier element improves. As a result, the Peltier element can improve cooling performance with respect to the semiconductor substrate.

Another aspect of the present disclosure is a semiconductor apparatus including a semiconductor substrate, a wiring substrate facing the semiconductor substrate, and a Peltier element disposed between the semiconductor substrate and the wiring substrate, in which the Peltier element has a second substrate and a thermoelectric semiconductor disposed between the wiring substrate and the second substrate, the second substrate has a first electrode provided on a surface side facing the wiring substrate, the wiring substrate has a second electrode provided on a surface side facing the second substrate, and the first electrode and the second electrode are each connected to the thermoelectric semiconductor.

As a result, the wiring substrate can also serve as a first substrate for the Peltier element (as a substrate disposed sandwiching the thermoelectric semiconductor on a reverse side of the second substrate, that is, as a substrate for, together with the second substrate, sandwiching the thermoelectric semiconductor). It is possible to integrate the Peltier element with the wiring substrate, and it is possible to reduce the number of components for the semiconductor apparatus. As a result, it is possible to reduce the thickness (reduce the profile) of the semiconductor apparatus, and it is possible to miniaturize the semiconductor apparatus. In addition, by integrating the Peltier element and the wiring substrate, heat exhaust efficiency from the Peltier element to the wiring substrate improves. As a result, the Peltier element can improve cooling performance with respect to the semiconductor substrate.

Yet another aspect of the present disclosure is a semiconductor apparatus including a semiconductor substrate, a wiring substrate facing the semiconductor substrate, and a Peltier element disposed between the semiconductor substrate and the wiring substrate, in which the Peltier element has a thermoelectric semiconductor disposed between the semiconductor substrate and the wiring substrate, the semiconductor substrate has a first electrode provided on a surface side facing the wiring substrate, the wiring substrate has a second electrode provided on a surface side facing the semiconductor substrate, and the first electrode and the second electrode are each connected to the thermoelectric semiconductor.

As a result, the wiring substrate can also serve as a first substrate for the Peltier element, and the semiconductor substrate also serves as a second substrate for the Peltier element. It is possible to integrate the semiconductor substrate, the Peltier element, and the wiring substrate, and it is possible to reduce the number of components for the semiconductor apparatus. As a result, it is possible to reduce the thickness (reduce the profile) of the semiconductor apparatus, and it is possible to miniaturize the semiconductor apparatus. In addition, by integrating the semiconductor substrate, the Peltier element, and the wiring substrate, heat exhaust efficiency from the semiconductor substrate to the wiring substrate improves. As a result, the Peltier element can improve cooling performance with respect to the semiconductor substrate.

BRIEF DESCRIPTION OF DRAWINGS

FIG. 8C is a cross-sectional view illustrating, in the order of steps, the method of manufacturing the semiconductor apparatus according to the second variation of the first embodiment of the present disclosure.

FIG. 8D is a cross-sectional view illustrating, in the order of steps, the method of manufacturing the semiconductor apparatus according to the second variation of the first embodiment of the present disclosure.

FIG. 22B is a cross-sectional view illustrating the method of manufacturing the semiconductor apparatus according to the second embodiment of the present disclosure.

FIG. 22C is a cross-sectional view illustrating the method of manufacturing the semiconductor apparatus according to the second embodiment of the present disclosure.

DESCRIPTION OF EMBODIMENTS

Figure 1:
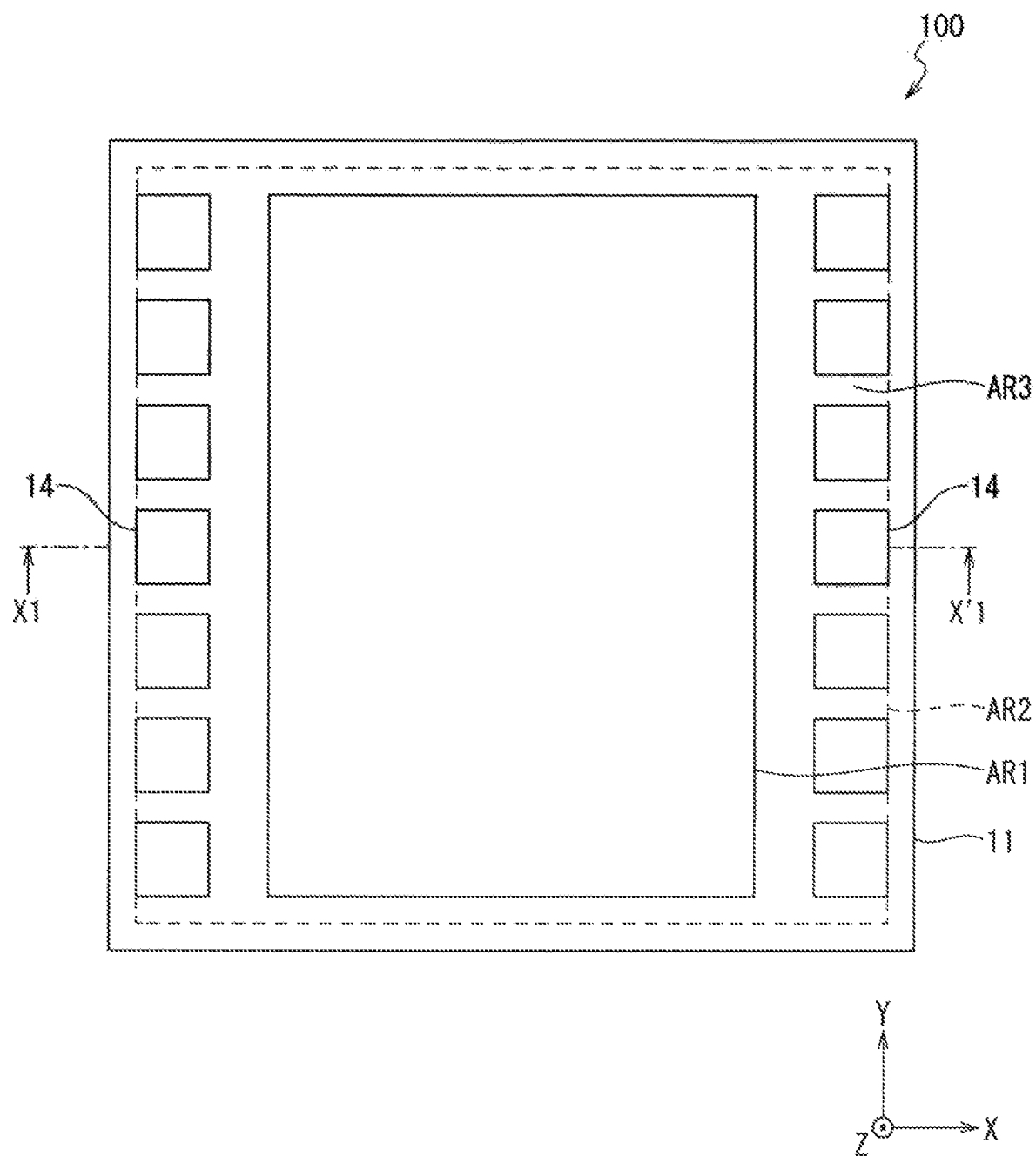
FIG. 1 is a plan view illustrating an example of a configuration of a semiconductor apparatus according to a first embodiment of the present disclosure.

Embodiments according to the present disclosure are described below with reference to the drawings. In the drawings to be referred to in the following description, the same or a similar reference sign is added to the same or similar portions. However, it should be noted that the drawings are schematic and differ from reality in the relationship between thickness, plane dimensions, ratios of the thicknesses of respective layers, etc. Accordingly, specific thicknesses or dimensions should be determined with reference to the following description. In addition, it is needless to say that there are portions for which the mutual relationship between dimensions or ratios are different between drawings.

In addition, a definition of directions such as up and down in the following description is simply a definition for the convenience of the description, and does not limit the technical concept of the present disclosure. For example, it is needless to say that, if a target is observed after being rotated by 90°, up and down are read as converted to left and right, and if the target is observed after being rotated by 180°, up and down are read as inverted.

In addition, the following description may describe directions by using the terms X-axis direction, Y-axis direction, and Z-axis direction. For example, the Z-axis direction is the thickness direction for a semiconductor substrate 11 described below, and is a normal direction for a bottom surface 11a of the semiconductor substrate 11. The X-axis direction and the Y-axis direction are directions which are orthogonal to the Z-axis direction. The X-axis direction, the Y-axis direction, and the Z-axis direction are orthogonal to each other. In addition, in the following description, "plan view" means viewing from the Z-axis direction.

First Embodiment (Configuration)

Figure 2:
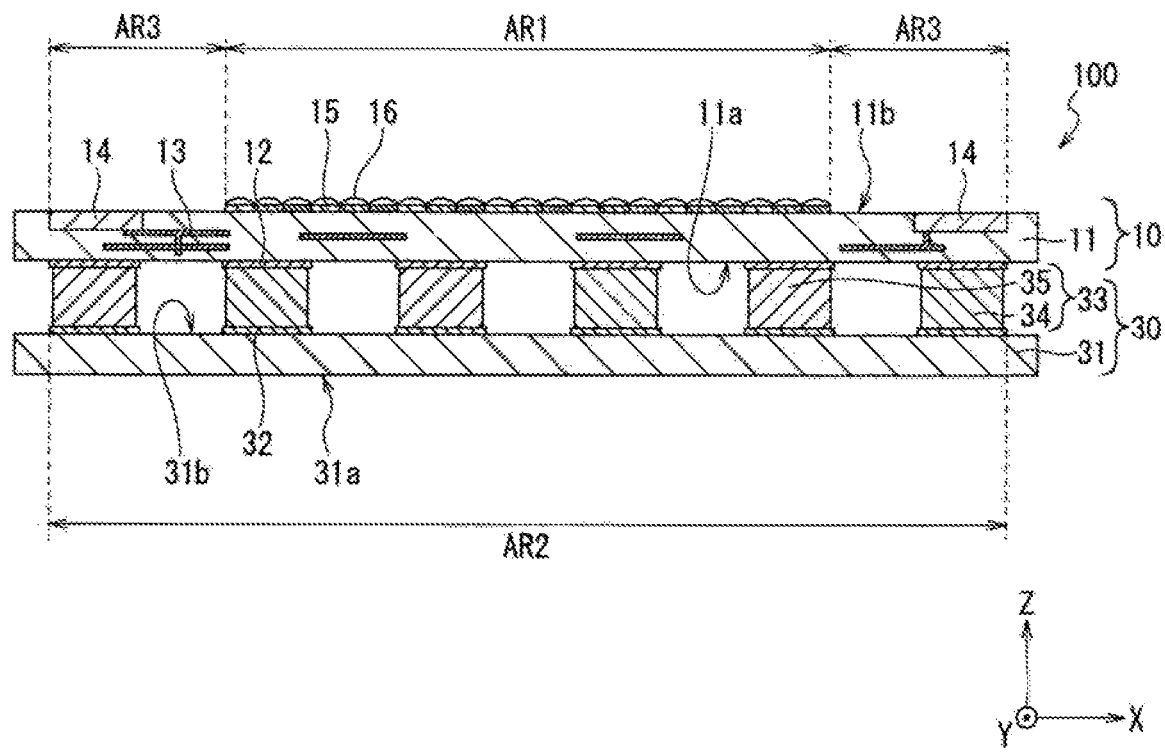
FIG. 2 is a cross-sectional view illustrating an example of a configuration of the semiconductor apparatus according to the first embodiment of the present disclosure.

FIG. 1 is a plan view illustrating an example of a configuration of a semiconductor apparatus 100 according to a first embodiment of the present disclosure. FIG. 2 is a cross-sectional view illustrating an example of the configuration of the semiconductor apparatus 100 according to the first embodiment of the present disclosure. FIG. 2 illustrates a cross-section resulting from cutting FIG. 1 along the X1-X'1 line. The semiconductor apparatus 100 illustrated in FIG. 1 and FIG. 2 is, for example, a sensor apparatus and is provided with a sensor element 10 and a Peltier element 30.

The sensor element 10 is, for example, a CMOS (Complementary Metal Oxide Semiconductor) image sensor or a CCD (Charge Coupled Device) image sensor. The sensor element 10 may be referred to as a sensor chip. The sensor element 10 is provided with a semiconductor substrate 11, first electrodes 12 provided on a bottom surface 11a side of the semiconductor substrate 11, external connection terminals 14 provided on a top surface 11b side of the semiconductor substrate 11, a plurality of pieces of wiring 13 provided in many layers inside the semiconductor substrate 11, a color filter layer 15 provided on the top surface 11b of the semiconductor substrate 11, and a micro-lens layer 16 provided on the color filter layer 15. The semiconductor substrate 11 is a silicon substrate, for example. The first electrode 12 includes, for example, copper (Cu) or a Cu alloy which has Cu as a main component.

The sensor element 10 detects light using photoelectric conversion in a pixel region AR1 where the color filter layer 15 and the micro-lens layer 16 are disposed. Light detected by the sensor element 10 is not limited to visible light and may be infrared rays or ultraviolet rays, for example.

The external connection terminals 14 are provided outside of the pixel region AR1. Each external connection terminal 14 is, for example, a bonding pad, and a wire such as a gold wire is connected to the external connection terminal 14. Each external connection terminal 14 is connected to the Peltier element 30 via the wiring 13 provided inside the semiconductor substrate. For example, the sensor element 10 has a pair of external connection terminals 14. From among the pair of external connection terminals 14, one external connection terminal 14 is used as a positive electrode side terminal for applying a positive potential to the Peltier element 30, and the other external connection terminal 14 is used as a negative electrode side terminal for applying a ground potential or a negative potential to the Peltier element 30. When a voltage is applied over the pair of external connection terminals 14, a current flows from the one external connection terminal 14, through a thermoelectric semiconductor 33 described below in the Peltier element 30, into the other external connection terminal 14.

The Peltier element 30 has a lower substrate 31 (an example of a "first substrate" in the present disclosure) and the thermoelectric semiconductor 33 which is disposed between the lower substrate 31 and the semiconductor substrate 11. The lower substrate 31 is a ceramic substrate, for example. The lower substrate 31 has second electrodes 32 provided on a top surface 31b side which faces the semiconductor substrate 11. A region AR2 in which the thermoelectric semiconductor 33 is disposed overlaps with the pixel region AR1 in plan view. For example, the region AR2 in which the thermoelectric semiconductor 33 is disposed overlaps with the pixel region AR1 and a peripheral region AR3 of the pixel region AR1 in plan view. Each second electrode 32 includes Cu or a Cu alloy, for example.

In the semiconductor apparatus 100, the first electrodes 12 on the semiconductor substrate 11 and second electrodes 32 on the lower substrate 31 are each connected to the thermoelectric semiconductor 33. The semiconductor substrate 11 is not only used as a substrate for the semiconductor apparatus 100 but is also used as an upper substrate for the Peltier element 30 (as a substrate disposed sandwiching the thermoelectric semiconductor 33 on an opposite side to the lower substrate 31, that is, as a substrate for, together with the lower substrate 31, sandwiching the thermoelectric semiconductor 33).

Figure 3:
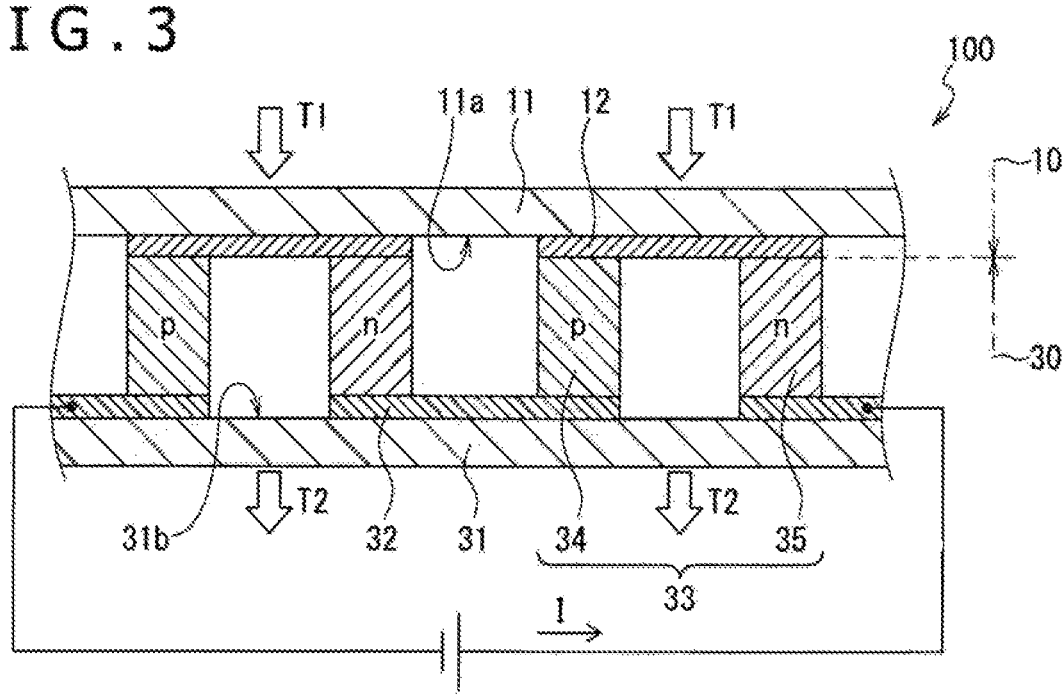
FIG. 3 is a cross-sectional view illustrating an example of a configuration of a Peltier element according to the first embodiment of the present disclosure.

FIG. 3 is a cross-sectional view illustrating an example of a configuration of the Peltier element 30 according to the first embodiment of the present disclosure. As illustrated in FIG. 3, the thermoelectric semiconductor 33 has a plurality of P-type thermoelectric semiconductors 34 and a plurality of N-type thermoelectric semiconductors 35. The P-type thermoelectric semiconductors 34 and the N-type thermoelectric semiconductors 35 are each disposed between the semiconductor substrate 11 and the lower substrate 31. The P-type thermoelectric semiconductors 34 and the N-type thermoelectric semiconductors 35 are disposed by being lined up alternatingly in one direction with intervals placed therebetween.

A first electrode 12 on the semiconductor substrate 11 is connected to an upper end of a P-type thermoelectric semiconductor 34 and an upper end of an N-type thermoelectric semiconductor 35. A second electrode 32 on the lower substrate 31 is connected to a lower end of the P-type thermoelectric semiconductor 34 and the lower end of an N-type thermoelectric semiconductor 35. The P-type thermoelectric semiconductors 34 and the N-type thermoelectric semiconductors 35 are alternatingly connected in series via the first electrodes 12 on the semiconductor substrate 11 and the second electrodes 32 on the lower substrate 31.

As illustrated in FIG. 3, in the Peltier element 30, when a direct current flows from the N-type thermoelectric semiconductor 35, the semiconductor substrate 11 absorbs heat T1 (absorbs heat), and the lower substrate 31 discharges head T2 (dissipates heat). The Peltier element 30 can release heat arising in the sensor element 10 to the outside of the semiconductor apparatus 100 via the lower substrate 31.

Next, description is given regarding a method of manufacturing the semiconductor apparatus 100 illustrated in FIG. 1 and FIG. 2. Note that various apparatuses such as an apparatus for forming the first electrodes 12, an apparatus for attaching the thermoelectric semiconductor 33, and a wire bonding apparatus are used to manufacture the semiconductor apparatus 100. In embodiments of the present disclosure, these apparatuses are generically called a manufacturing apparatus. In addition, at least a portion of work performed by the manufacturing apparatus may be performed by a worker.

Figure 4A:
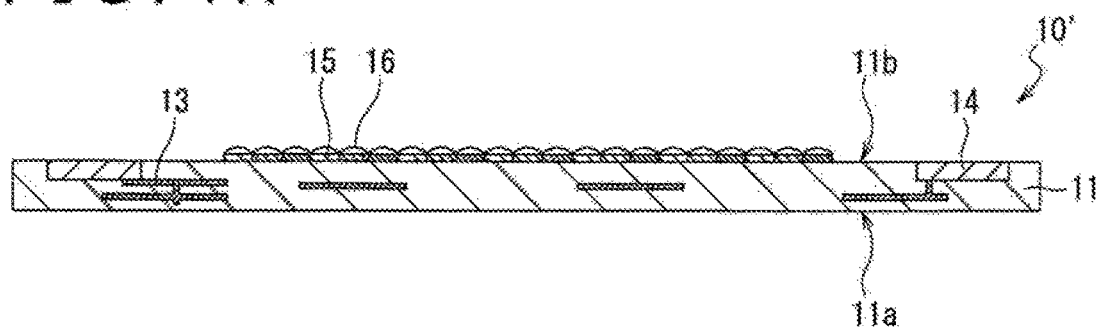
FIG. 4A is a cross-sectional view illustrating a method of manufacturing the semiconductor apparatus according to the first embodiment of the present disclosure.

(Manufacturing method) FIGS. 4A, 4B, 4C, 4D, and 4E are cross-sectional views that illustrate a method of manufacturing the semiconductor apparatus 100 according to the first embodiment of the present disclosure. As illustrated in FIG. 4A, a manufacturing apparatus manufactures a sensor wafer 10'. The sensor wafer 10' is a substrate that is yet to be diced, on which multiple units of the sensor element 10 have been formed. Note that, in the step in FIG. 4A, the first electrodes 12 (refer to FIG. 2) have not been formed. The first electrodes 12 are formed in the step in FIG. 4C which is described below.

Figure 4B:
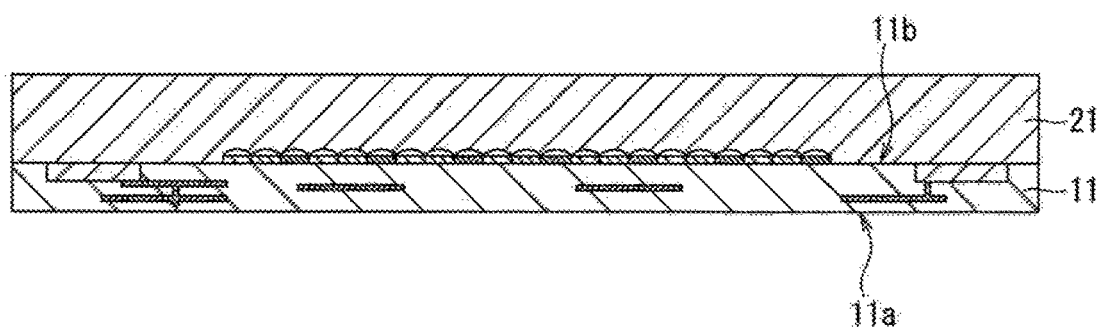
FIG. 4B is a cross-sectional view illustrating the method of manufacturing the semiconductor apparatus according to the first embodiment of the present disclosure.

Next, as illustrated in FIG. 4B, the manufacturing apparatus pastes a support substrate 21 onto the top surface 11b side of the semiconductor substrate 11. By the support substrate 21, the top surface 11b side of the semiconductor substrate 11, which includes the color filter layer 15 and the micro-lens layer 16, is protected.

Figure 4C:
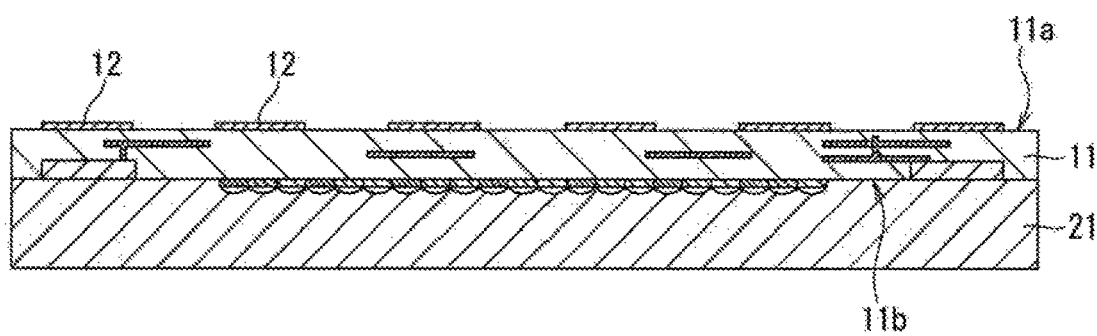
FIG. 4C is a cross-sectional view illustrating the method of manufacturing the semiconductor apparatus according to the first embodiment of the present disclosure.

Next, as illustrated in FIG. 4C, the manufacturing apparatus horizontally inverts the semiconductor substrate 11 so that the bottom surface 11a side of the semiconductor substrate 11 faces upward and forms the first electrodes 12 on the bottom surface 11a side of the semiconductor substrate 11. For example, the manufacturing apparatus uses vapor deposition, sputtering, or CVD to form a copper (Cu) film on the bottom surface 11a side of the semiconductor substrate 11. Next, the manufacturing apparatus uses photolithography to form a resist pattern with a predetermined shape on the Cu film. Next, the manufacturing apparatus, using the resist pattern as a mask, etches the Cu film. As a result, the manufacturing apparatus forms the first electrodes 12 from the Cu film. Alternatively, the manufacturing apparatus may use a lift-off method to form the first electrodes 12 from the Cu film. The manufacturing apparatus may form the first electrodes 12 by an optionally-defined method.

Figure 4D:
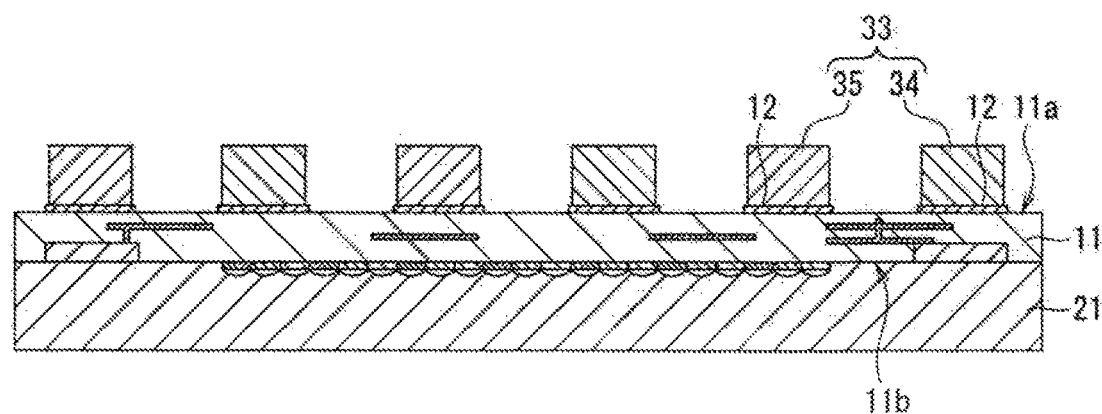
FIG. 4D is a cross-sectional view illustrating the method of manufacturing the semiconductor apparatus according to the first embodiment of the present disclosure.

Next, as illustrated in FIG. 4D, the manufacturing apparatus attaches P-type thermoelectric semiconductors 34 and N-type thermoelectric semiconductors 35 onto the first electrodes 12. For example, the manufacturing apparatus presses a sheet, onto which P-type thermoelectric semiconductors 34 and N-type thermoelectric semiconductors 35 have been pasted in advance, onto the bottom surface 11a side of the semiconductor substrate 11, causes the P-type thermoelectric semiconductors 34 and the N-type thermoelectric semiconductors 35 to respectively join with the first electrodes 12, and subsequently removes only the sheet to thereby attach the P-type thermoelectric semiconductors 34 and the N-type thermoelectric semiconductors 35 to the first electrodes 12. In addition, the manufacturing apparatus may attach the P-type thermoelectric semiconductors 34 and the N-type thermoelectric semiconductors 35 onto the first electrodes 12 by another method. For example, each P-type thermoelectric semiconductor 34 and N-type thermoelectric semiconductor 35 may be attached one at a time onto the first electrodes 12.

Figure 4E:
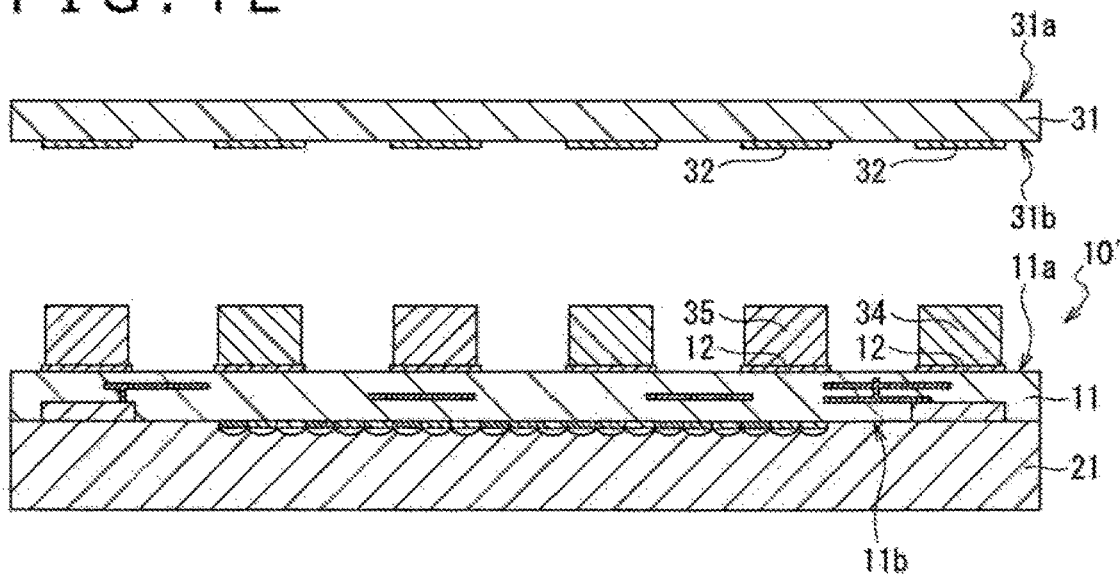
FIG. 4E is a cross-sectional view illustrating the method of manufacturing the semiconductor apparatus according to the first embodiment of the present disclosure.

Next, as illustrated in FIG. 4E, the manufacturing apparatus faces the top surface 31b side of the lower substrate 31 downward, and respectively joins the second electrodes 32 on the lower substrate 31 with the P-type thermoelectric semiconductors 34 and the N-type thermoelectric semiconductors 35. Next, the manufacturing apparatus dices the sensor wafer 10' and the lower substrate 31 to singulate each semiconductor apparatus 100. Subsequently, the manufacturing apparatus causes the support substrate 21 to detach from the top surface 11b side of the semiconductor substrate 11. Through the above steps, the semiconductor apparatus 100 illustrated in FIG. 1 and FIG. 2 is completed.

As described above, the semiconductor apparatus 100 according to the first embodiment of the present disclosure is provided with a semiconductor substrate 11 and a Peltier element 30 disposed facing the semiconductor substrate 11. The Peltier element 30 has the lower substrate 31 and the thermoelectric semiconductor 33 which is disposed between the lower substrate 31 and the semiconductor substrate 11. The semiconductor substrate 11 has first electrodes 12 provided on the bottom surface 11a which faces the lower substrate 31. The lower substrate 31 has second electrodes 32 provided on the top surface 31b side which faces the semiconductor substrate 11. The first electrodes 12 and the second electrodes 32 are each connected to the thermoelectric semiconductor 33. For example, the thermoelectric semiconductor 33 has a plurality of P-type thermoelectric semiconductors 34 and a plurality of N-type thermoelectric semiconductors 35. The P-type thermoelectric semiconductors 34 and the N-type thermoelectric semiconductors 35 are alternatingly connected in series via the first electrodes 12 and the second electrodes 32.

As a result, the semiconductor substrate 11 can also serve as an upper substrate for the Peltier element 30 (as a substrate disposed sandwiching the thermoelectric semiconductor 33 on a reverse side of the lower substrate 31, that is, as a substrate for, together with the lower substrate 31, sandwiching the thermoelectric semiconductor 33). It is possible to integrate the Peltier element 30 with the semiconductor substrate 11, and it is possible to reduce the number of components for the semiconductor apparatus 100. As a result, it is possible to reduce the thickness (reduce the profile) of the semiconductor apparatus 100, and it is possible to miniaturize the semiconductor apparatus 100.

In addition, by integrating the semiconductor substrate 11 and the Peltier element 30, heat exhaust efficiency from the semiconductor substrate 11 to the Peltier element 30 improves. Because there is no substrate (upper substrate) for supporting the thermoelectric semiconductor 33 between the semiconductor substrate 11 and the Peltier element 30, heat exhaust from the semiconductor substrate 11 to the Peltier element 30 is performed with good efficiency. As a result, the Peltier element 30 can improve cooling performance with respect to the semiconductor substrate 11.

In addition, input and output of a current to and from the Peltier element 30 is via wiring such as the gold wire which is connected to the external connection terminals 14 and not dedicated Peltier element lead-out wiring which is led out to the outside of the semiconductor substrate 11. Because dedicated Peltier element lead-out wiring is unnecessary, a further space reduction is possible. As a result, further miniaturization of the semiconductor apparatus 100 is possible.

In addition, the upper substrate for the Peltier element 30 and adhesive for joining the dedicated Peltier element lead-out wiring and the upper substrate with the semiconductor substrate are unnecessary, and it is possible to reduce the number of components. As a result, it is possible to address lowering costs for the semiconductor apparatus 100.

In addition, because there is no adhesive resin or upper substrate between the semiconductor substrate 11 and the thermoelectric semiconductor 33, it is possible to suppress warping of the semiconductor substrate 11. In other words, a typical resin has a higher coefficient of linear expansion than an adhesive base material or a device, and therefore expands/contracts and undergoes changes in elastic modulus in accordance with temperature. Accordingly, a typical resin is likely to be a cause of warping of the semiconductor substrate 11. However, because there is no adhesive resin between the semiconductor substrate 11 and the thermoelectric semiconductor 33 in the semiconductor apparatus 100, it is possible to suppress warping of the semiconductor substrate 11.

(First Variation)

Figure 5:
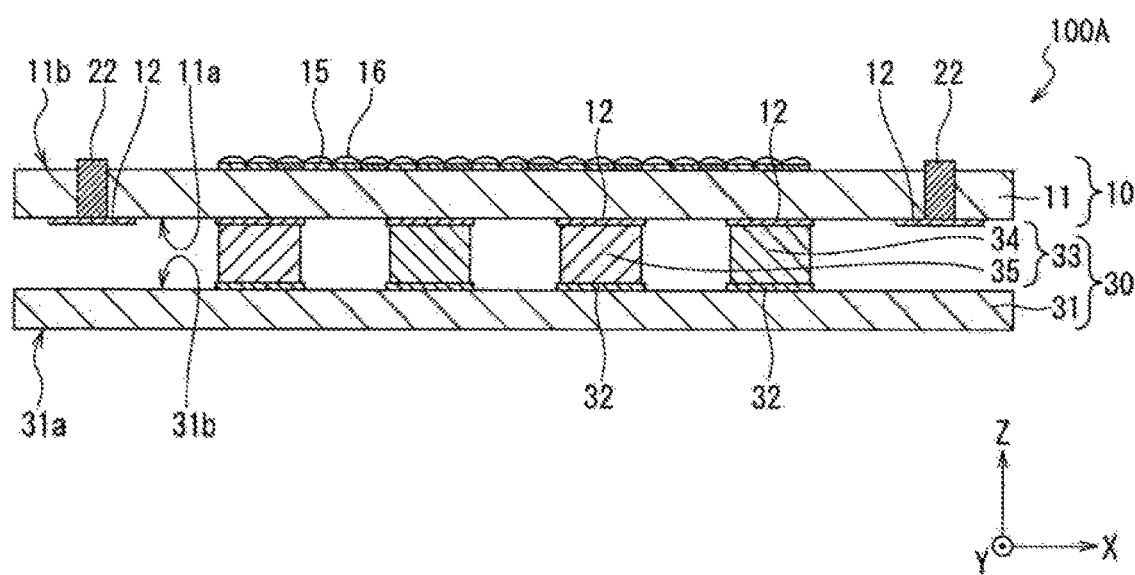
FIG. 5 is a cross-sectional view illustrating an example of a configuration of a semiconductor apparatus according to a first variation of the first embodiment of the present disclosure.

FIG. 5 is a cross-sectional view illustrating an example of a configuration of a semiconductor apparatus 100A according to a first variation of the first embodiment of the present disclosure. As illustrated in FIG. 5, a semiconductor substrate 11 in the semiconductor apparatus 100A may be provided with through electrodes 22 (an example of a "first through electrode" in the present disclosure) which penetrate the semiconductor substrate 11 in the thickness direction thereof. The through electrodes 22 penetrates between a bottom surface 11a and a top surface 11b of the semiconductor substrate 11. The through electrodes 22 include a metal such as Cu, for example.

In addition, the through electrodes 22 may be used as external connection terminals for applying a potential to the Peltier element 30. For example, a sensor element 10 has a pair of through electrodes 22 provided in a peripheral region AR3 (refer to FIG. 1) positioned outside of a pixel region AR1 (refer to FIG. 1). The upper end of a through electrode 22 is used as a bonding pad which is exposed on the top surface 11b side of the semiconductor substrate 11. A wire such as a gold wire is connected to the bonding pad. The lower end of a through electrode 22 is connected to a first electrode 12 in the sensor element 10. Even with such a configuration, the semiconductor apparatus 100A achieves a similar effect to that of the semiconductor apparatus 100 described above.

Note that, even in the semiconductor apparatus 100A illustrated in FIG. 5, an external connection terminal 14 as illustrated in FIG. 2 may be provided separately from the through electrodes 22. In addition, although illustration is not given in FIG. 5, wiring 13 may be provided inside the semiconductor substrate 11.

Figure 6A:
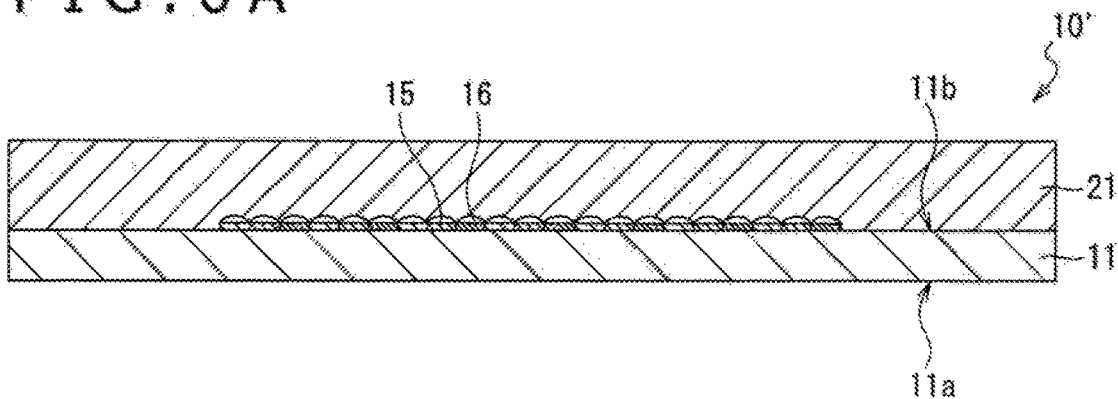
FIG. 6A is a cross-sectional view illustrating, in the order of steps, a method of manufacturing the semiconductor apparatus according to the first variation of the first embodiment of the present disclosure.

Next, description is given for a method of manufacturing the semiconductor apparatus 100A illustrated in FIG. 5. FIGS. 6A, 6B, 6C, 6D, and 6E are cross-sectional views illustrating, in the order of steps, the method of manufacturing the semiconductor apparatus 100A according to the first variation of the first embodiment of the present disclosure. In FIG. 6A, the method is the same as the manufacturing method described with reference to FIGS. 4A and 4B before a step for pasting the support substrate 21 onto the top surface 11b side of the semiconductor substrate 11.

Figure 6B:
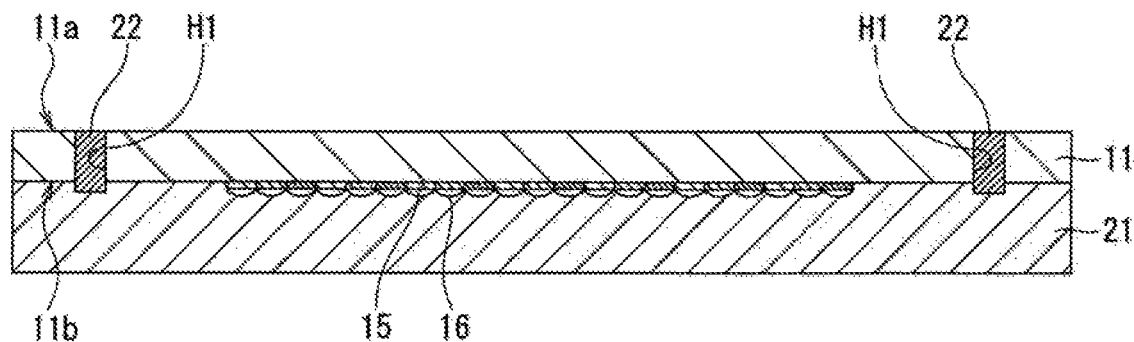
FIG. 6B is a cross-sectional view illustrating, in the order of steps, the method of manufacturing the semiconductor apparatus according to the first variation of the first embodiment of the present disclosure.
Figure 6C:
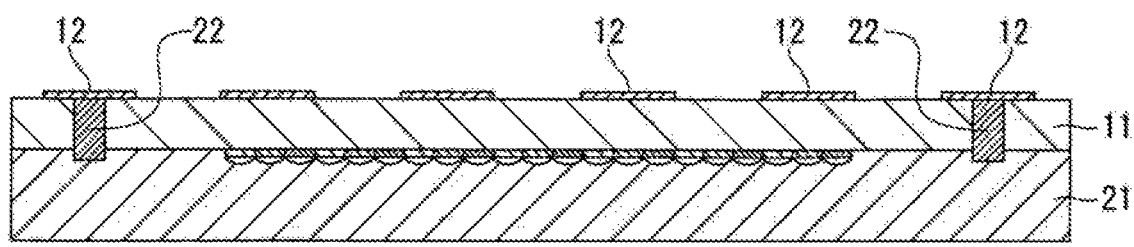
FIG. 6C is a cross-sectional view illustrating, in the order of steps, the method of manufacturing the semiconductor apparatus according to the first variation of the first embodiment of the present disclosure.

After the support substrate 21 is pasted on, as illustrated in FIG. 6B, a manufacturing apparatus horizontally inverts the semiconductor substrate 11 so that the bottom surface 11a side of the semiconductor substrate 11 faces upward. The manufacturing apparatus then forms, from the bottom surface 11a side of the semiconductor substrate 11, through holes (vias) H1 which penetrate between the bottom surface 11a and the top surface 11b of the semiconductor substrate 11. Next, the manufacturing apparatus forms through electrode 22 inside the through holes H1. Next, as illustrated in FIG. 6C, the manufacturing apparatus forms the first electrodes 12 on the bottom surface 11a side of the semiconductor substrate 11. The lower end of a through electrode 22 (the upper side end in FIG. 6C) is covered by a first electrode 12.

Figure 6D:
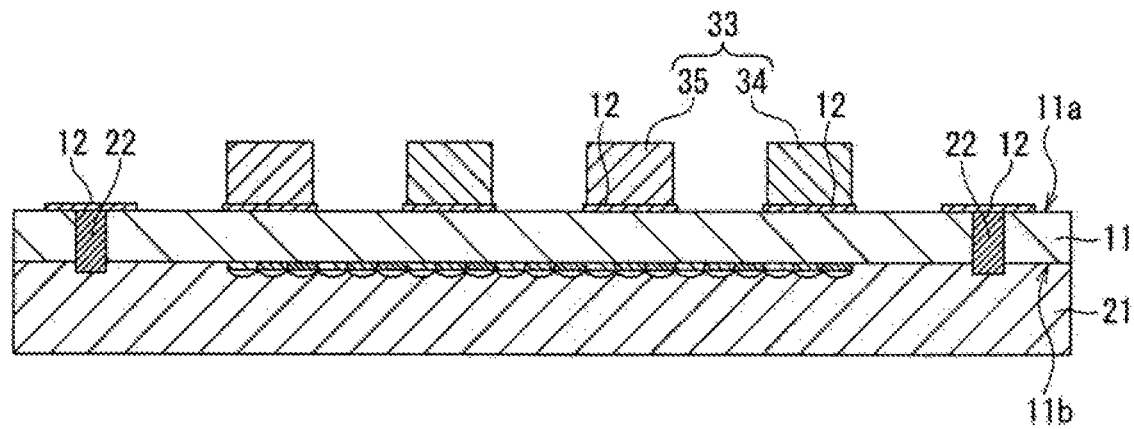
FIG. 6D is a cross-sectional view illustrating, in the order of steps, the method of manufacturing the semiconductor apparatus according to the first variation of the first embodiment of the present disclosure.
Figure 6E:
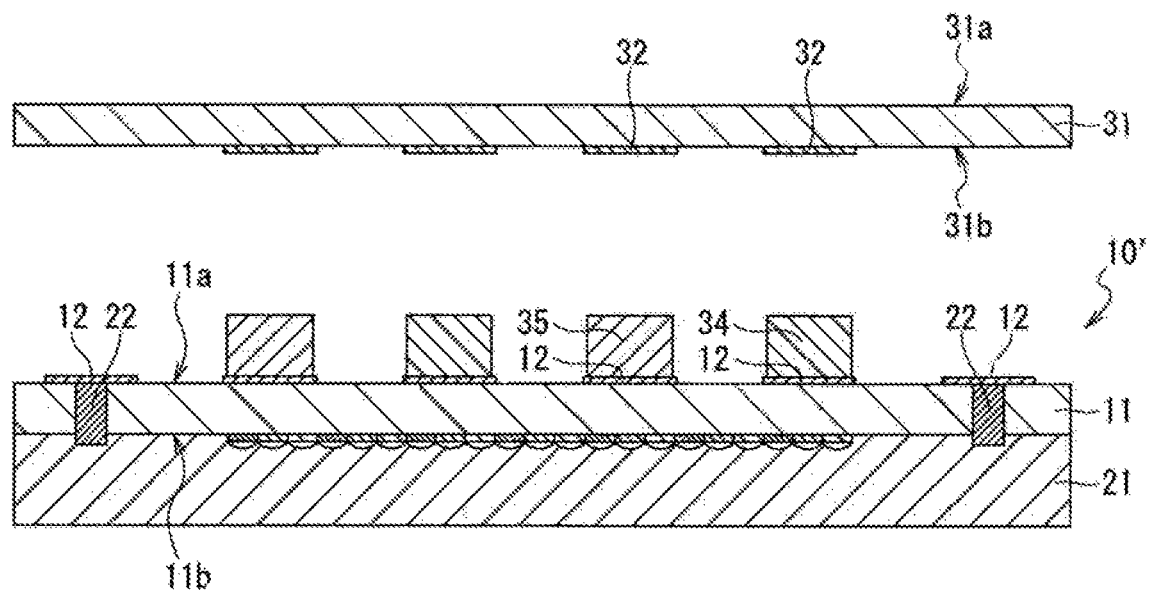
FIG. 6E is a cross-sectional view illustrating, in the order of steps, the method of manufacturing the semiconductor apparatus according to the first variation of the first embodiment of the present disclosure.

Steps that are subsequent to this are the same as the manufacturing method described with reference to FIGS. 4D and 4E. As illustrated in FIG. 6D, the manufacturing apparatus attaches P-type thermoelectric semiconductors 34 and N-type thermoelectric semiconductors 35 onto the first electrodes 12. Next, as illustrated in FIG. 6E, the manufacturing apparatus faces the top surface 31b side of the lower substrate 31 downward, and respectively joins the second electrodes 32 on the lower substrate 31 with the P-type thermoelectric semiconductors 34 and the N-type thermoelectric semiconductors 35. Next, the manufacturing apparatus dices the sensor wafer 10' and the lower substrate 31 to singulate each semiconductor apparatus 100A. Subsequently, the manufacturing apparatus causes the support substrate 21 to detach from the top surface 11b side of the semiconductor substrate 11. Through the above steps, the semiconductor apparatus 100A illustrated in FIG. 5 is completed.

(Second Variation)

Figure 7:
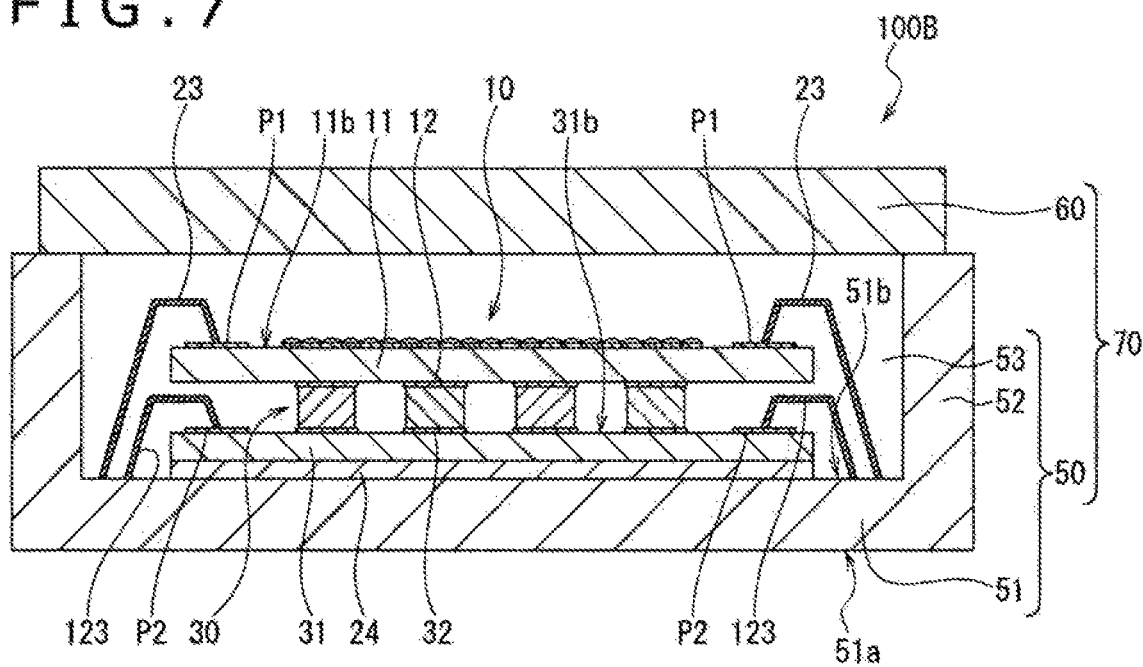
FIG. 7 is a cross-sectional view illustrating an example of a configuration of a semiconductor apparatus according to a second variation of the first embodiment of the present disclosure.

FIG. 7 is a cross-sectional view illustrating an example of a configuration of a semiconductor apparatus 100B according to a second variation of the first embodiment of the present disclosure. As illustrated in FIG. 7, the semiconductor apparatus 100B is provided with a package body 50, and a lid 60 attached to a top surface side of the package body 50. In accordance with the package body 50 and the lid 60, a package 70 for accommodating and sealing, in an airtight manner, the sensor element 10 and the Peltier element 30 is configured.

In the semiconductor apparatus 100B, bonding pads P1 for connecting to the sensor element 10 are provided on a top surface 111b side of a semiconductor substrate 11. A wire 23 is joined to each bonding pad P1. For the sensor element 10, input and output of a power supply or signals is possible via the bonding pads P1 and the wires 23.

Bonding pads P2 for input and output of a current to and from the Peltier element 30 are provided on a top surface 111b side of a lower substrate 11. The bonding pads P2 are connected to second electrodes 32 provided on the top surface 111b side of the lower substrate 11. In addition, a wire 123 is joined to each bonding pad P2. A current is applied to the Peltier element 30 via the wires 123 and the bonding pads P2.

The bonding pads P1 and P2 include, for example, aluminum (Al), an Al alloy having Al as a main component, copper (Cu), or a Cu alloy having Cu as a main component. The wires 32 and 132 are gold wire, for example.

The package body 50 has a bottom 51 onto which the lower substrate 31 of the Peltier element 30 is attached via a die bond material 24, and walls 52 disposed at the perimeter of the bottom 51. For example, the bottom 51 and the walls 52 are integrally formed. The sensor element 10 and the Peltier element 30 are disposed in a space 53 which is inside the package 70 and is surrounded by the bottom 51 and the walls 52. In the semiconductor apparatus 100B, the package body 50 includes a ceramic, for example.

The lid 60 includes a material that transmits light detected by the sensor element 10, and includes a translucent glass material or a translucent resin, for example. The lid 60 may have a frame (not illustrated) which is bonded to the walls of the package body 50 without gaps. The frame includes a ceramic or a metal, for example.

Bonding pads (not illustrated) to which respective ends of the wires 23 and 123, which are, for example, a gold wire, are respectively connected are provided on a top surface 51b side of the bottom 51. Bonding pads to which the wires 23 are connected and bonding pads to which the wires 123 are connected are distant from each other and are electrically separated from each other. In addition, a plurality of pieces of wiring (not illustrated) is provided inside the bottom 51 in a multi-layer fashion. These pieces of wiring are connected to the bonding pads provided on the top surface 51b side of the bottom, and to a plurality of terminals (not illustrated) provided on a bottom surface 51a side of the bottom 51. The plurality of terminals provided on the bottom surface 51a side of the bottom 51 may be pin-shaped terminals which protrude in a normal direction for the bottom surface 51a or may be ball-shaped terminals. The through electrodes 22 in the sensor element 10 are led out to the outside of the package 70 via the wires 23, the bonding pads provided on the top surface 51b side of the bottom 51, the wiring provided inside the bottom 51, and the terminals provided on the bottom surface 51a side of the bottom.

In the semiconductor apparatus 100B, the sensor element 10 and the Peltier element 30 are disposed and sealed, in an airtight manner, in the space 53 inside the package 70. As a result, the semiconductor apparatus 100B can suppress foreign matter adhering to the sensor element 10, and can reduce the possibility of the foreign matter causing an impact on the operation of the sensor element 10.

Figure 8A:
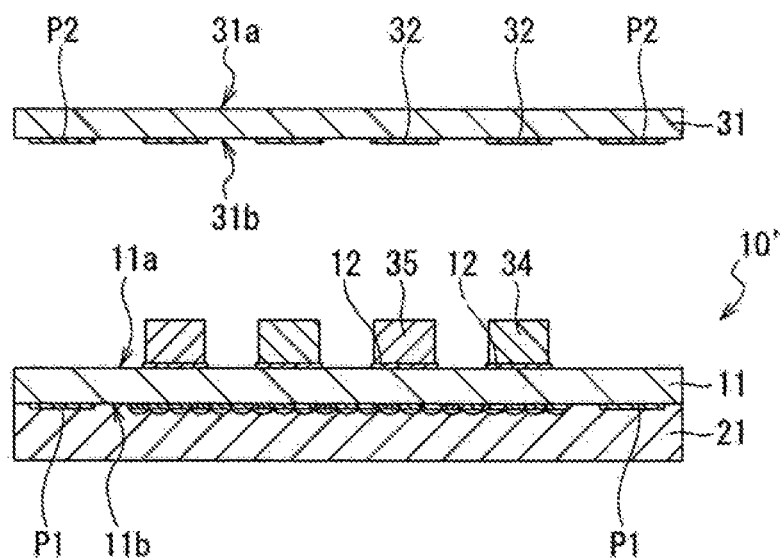
FIG. 8A is a cross-sectional view illustrating, in the order of steps, a method of manufacturing the semiconductor apparatus according to the second variation of the first embodiment of the present disclosure.
Figure 8B:
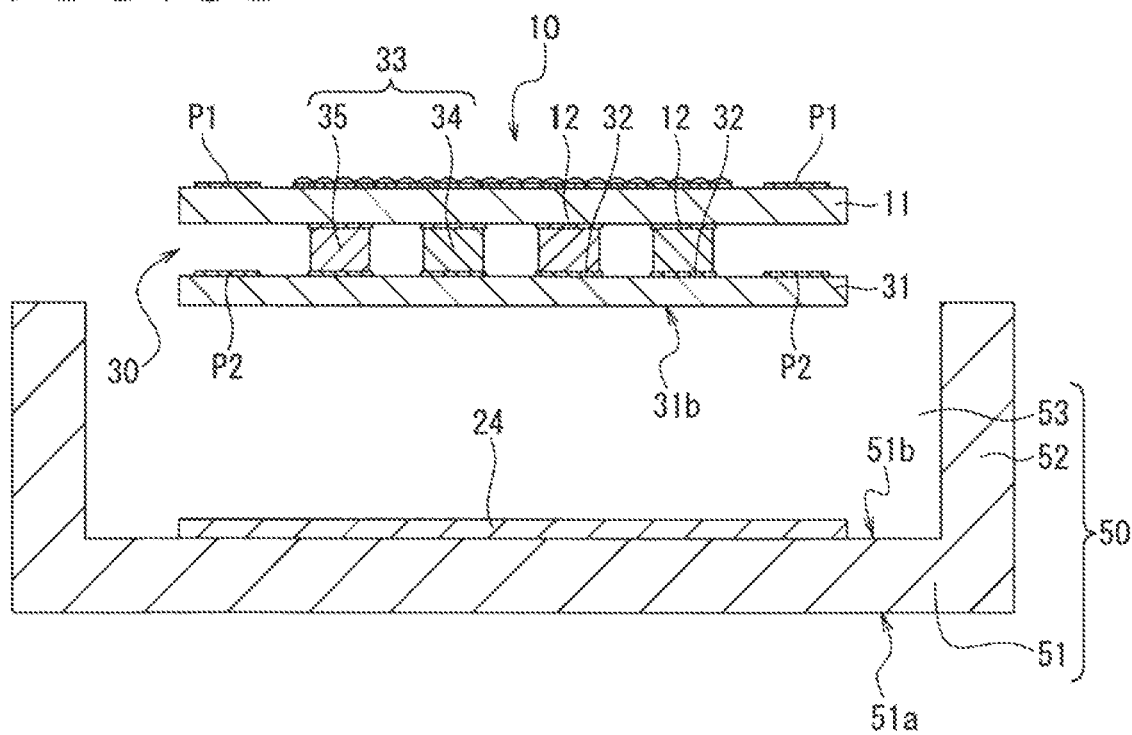
FIG. 8B is a cross-sectional view illustrating, in the order of steps, the method of manufacturing the semiconductor apparatus according to the second variation of the first embodiment of the present disclosure.

Next, description is given for a method of manufacturing the semiconductor apparatus 100B illustrated in FIG. 7. FIGS. 8A, 8B, 8C, and 8D are cross-sectional views illustrating, in the order of steps, the method of manufacturing the semiconductor apparatus 100B according to the second variation of the first embodiment of the present disclosure. For FIG. 8A, the method is the same as the manufacturing method described with reference to FIGS. 6A, 6B, 6C, 6D, and 6E before a step for attaching the thermoelectric semiconductor 33 to the bottom surface 11a side of the semiconductor substrate 11, singulating each semiconductor apparatus 100A by dicing, and subsequently detaching the support substrate 21. Before or after the step for detaching the support substrate 21, a manufacturing apparatus coats the die bond material 24 on the top surface 51b side of the bottom 51 of the package body 50, as illustrated in FIG. 8B.

Next, as illustrated in FIG. 8C, the manufacturing apparatus attaches the lower substrate 31 to the top surface 51b side of the bottom 51, via the die bond material 24. Next, the manufacturing apparatus connects, by the wires 23, bonding pads P1 on the sensor element 10 with bonding pads (not illustrated) provided on the top surface 51b side of the bottom 51. In addition, the bonding pads provided on the top surface 31b side of the lower substrate 31 and bonding pads (not illustrated) provided on the top surface 51b side of the bottom 51 are connected by the wires 123. Next, as illustrated in FIG. 8D, the manufacturing apparatus attaches, by means such as seam welding, for example, the lid 60 to the package body 50 in a state where the lid 60 and the walls 52 of the package body 50 are mutually aligned. As a result, the space 53 between the lid 60 and the package body 50 is sealed in an airtight manner.

The seam welding is one type of resistance welding and is a method for continuously welding by using roller electrodes and rotating the electrodes while applying pressure and energizing the roller electrodes. By making a chamber in which a seam welding apparatus is provided have a dry air, nitrogen, or vacuum atmosphere, etc., this step enables the atmosphere inside the package (in other words, the space 53) to be kept as dry air, nitrogen, or vacuum. Note that, in embodiments of the present disclosure, joining of the lid 60 and the package body 50 is not limited to the seam welding. Joining of the lid 60 and the package body 50 may be joining that uses an adhesive, for example. Through the above steps, the semiconductor apparatus 100B illustrated in FIG. 7 is completed.

(Third Variation)

Figure 9:
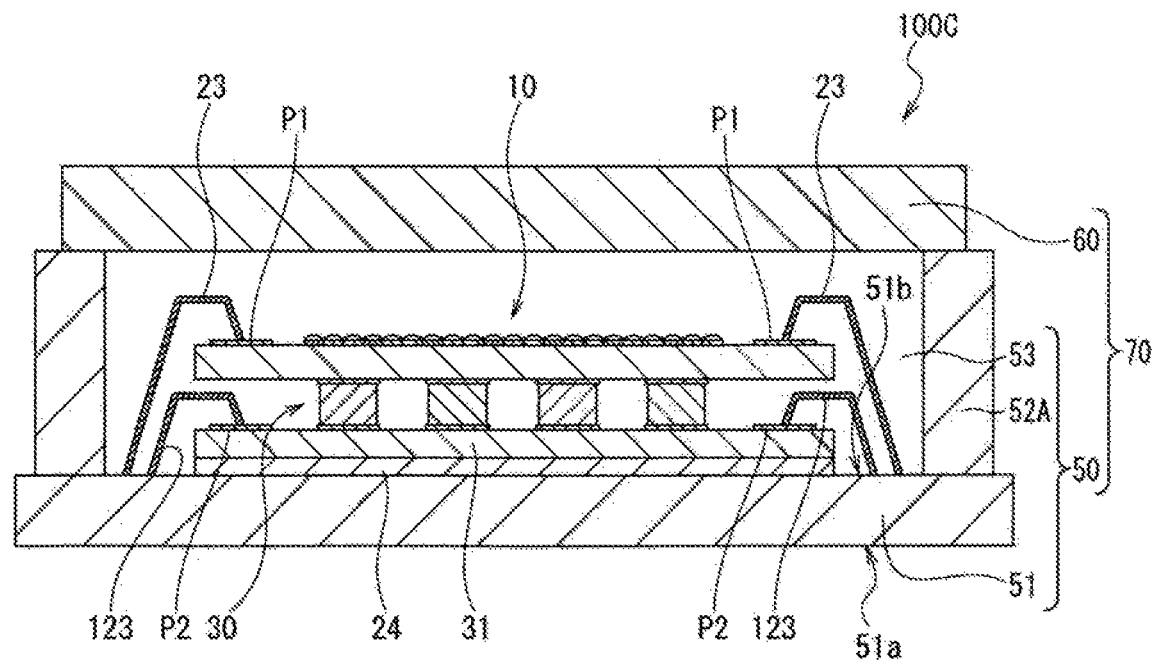
FIG. 9 is a cross-sectional view illustrating a configuration of a semiconductor apparatus according to a third variation of the first embodiment of the present disclosure.

FIG. 9 is a cross-sectional view illustrating a configuration of a semiconductor apparatus 100C according to a third variation of the first embodiment of the present disclosure. For the semiconductor apparatus 100C illustrated in FIG. 9, a difference with the semiconductor apparatus 100B illustrated in FIG. 7 is the structure of the package body 50. The package body 50 included in the semiconductor apparatus 100C has a bottom 51 onto which the lower substrate 31 of the Peltier element 30 is attached via a die bond material 24, and walls 52A disposed at the perimeter of the bottom 51. The bottom 51 and the walls 52A are separately formed, and include mutually different materials, for example. To give an example, the bottom 51 includes a ceramic, whereas the walls 52A include a resin or a metal. The bottom 51 and the walls 52As are joined to each other via an adhesive (not illustrated), for example.

The semiconductor apparatus 100C achieves a similar effect to that of the semiconductor apparatus 100B. In addition, as described in a manufacturing method described below, before attaching the walls 52A at the perimeter of the bottom 51, it is possible to attach the Peltier element 30 and the sensor element 10 onto the top surface 51b side of the bottom 51 or to perform wire bonding. When the sensor element 10 is attached to the package body 50, the walls 52As are not present on the top surface 51b side of the bottom 51 and the top surface 51b of the bottom 51 is flat. Therefore, attaching the Peltier element 30 and the sensor element 10, and wire bonding are easier. Accordingly, for the semiconductor apparatus 100C, it is possible to improve productivity in comparison to the semiconductor apparatus 100B.

Figure 10A:
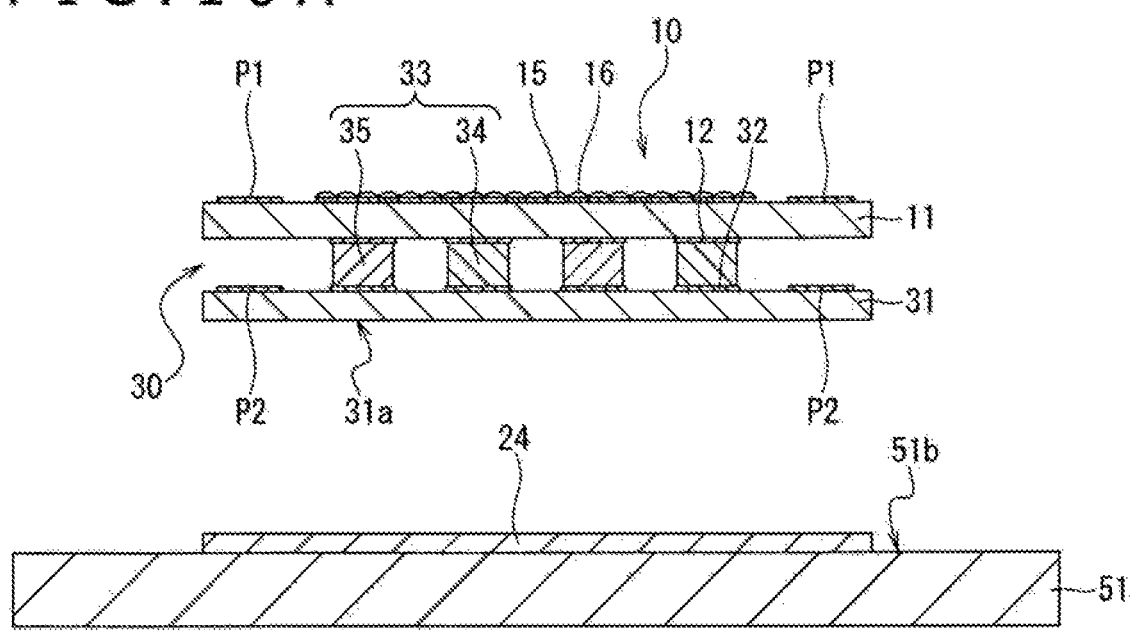
FIG. 10A is a cross-sectional view illustrating, in the order of steps, a method of manufacturing the semiconductor apparatus according to the third variation of the first embodiment of the present disclosure.

Next, description is given for a method of manufacturing the semiconductor apparatus 100C illustrated in FIG. 9. FIGS. 10A, 10B, 10C, and 10D are cross-sectional views illustrating, in the order of steps, the method of manufacturing the semiconductor apparatus 100C according to the third variation of the first embodiment of the present disclosure. In FIG. 10A, the method is the same as the manufacturing method described with reference to FIGS. 8A and 8B before a step for coating the die bond material 24 onto the top surface 51b side of the bottom 51 of the package body 50A.

Figure 10B:
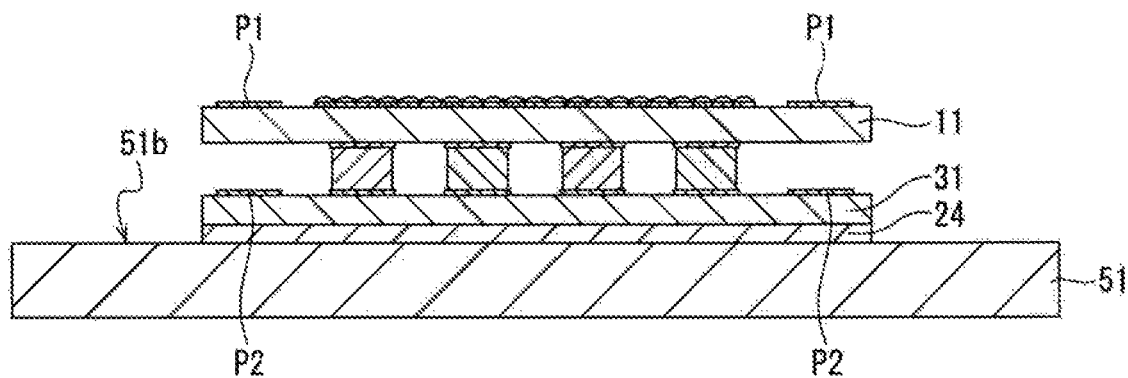
FIG. 10B is a cross-sectional view illustrating, in the order of steps, the method of manufacturing the semiconductor apparatus according to the third variation of the first embodiment of the present disclosure.
Figure 10C:
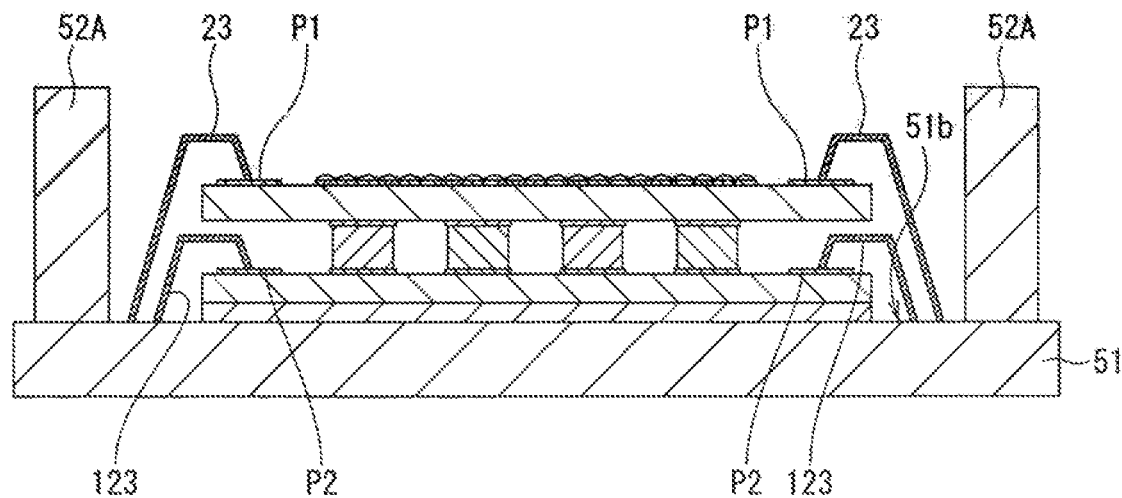
FIG. 10C is a cross-sectional view illustrating, in the order of steps, the method of manufacturing the semiconductor apparatus according to the third variation of the first embodiment of the present disclosure.

After the die bond material 24 is coated, as illustrated in FIG. 10B, a manufacturing apparatus attaches the lower substrate 31 to the top surface 51b side of the bottom 51, via the die bond material 24. Next, as illustrated in FIG. 10C, the manufacturing apparatus, by the wires 23, connects bonding pads P1 on the sensor element 10 with bonding pads (not illustrated) provided on the top surface 51b side of the bottom 51 (a first wire bonding step). In addition, the manufacturing apparatus, by the wires 123, connects bonding pads P2 on the lower substrate 31 with bonding pads (not illustrated) provided on the top surface 51b side of the bottom 51 (a second wire bonding step). Next, the manufacturing apparatus, via an adhesive etc., attaches the walls 52A to the top surface 51b side of the bottom 51. Note that, in embodiments of the present disclosure, the first wire bonding step and the second wire bonding step may be performed after a step for attaching the walls 52A.

Figure 10D:
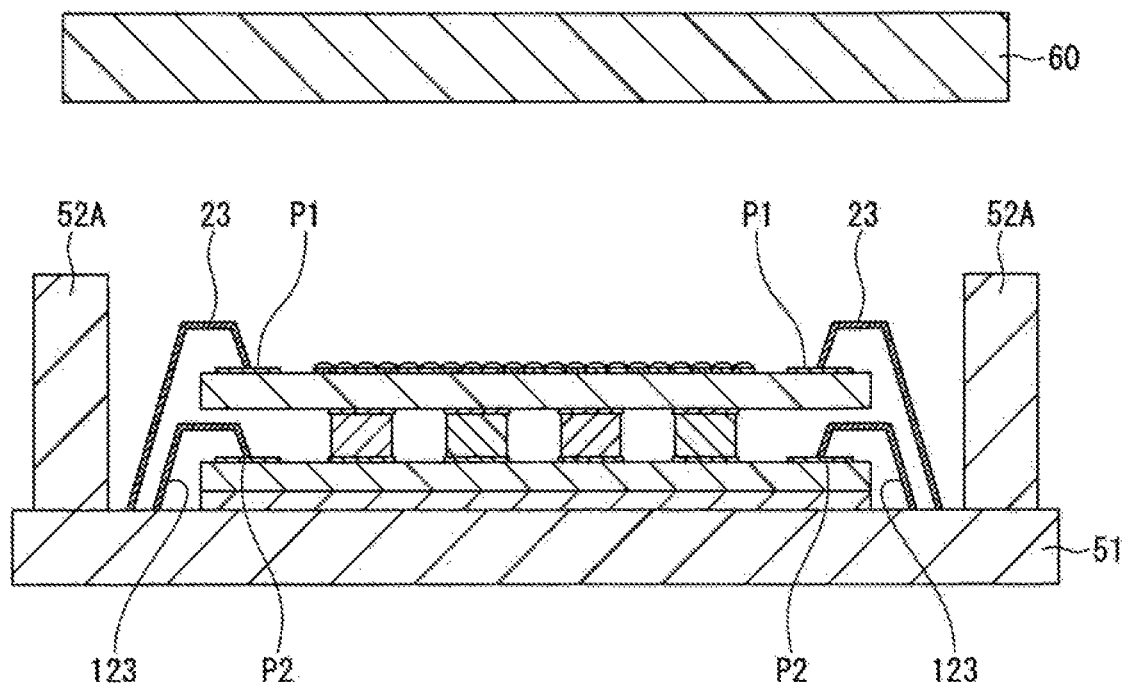
FIG. 10D is a cross-sectional view illustrating, in the order of steps, the method of manufacturing the semiconductor apparatus according to the third variation of the first embodiment of the present disclosure.

Next, as illustrated in FIG. 10D, the manufacturing apparatus attaches the lid 60 onto the walls 52A of the package body 50, and seals, in an airtight manner, the space 53 between the lid 60 and the package body 50. Through the above steps, the semiconductor apparatus 100C illustrated in FIG. 9 is completed.

(Fourth Variation)

Figure 11:
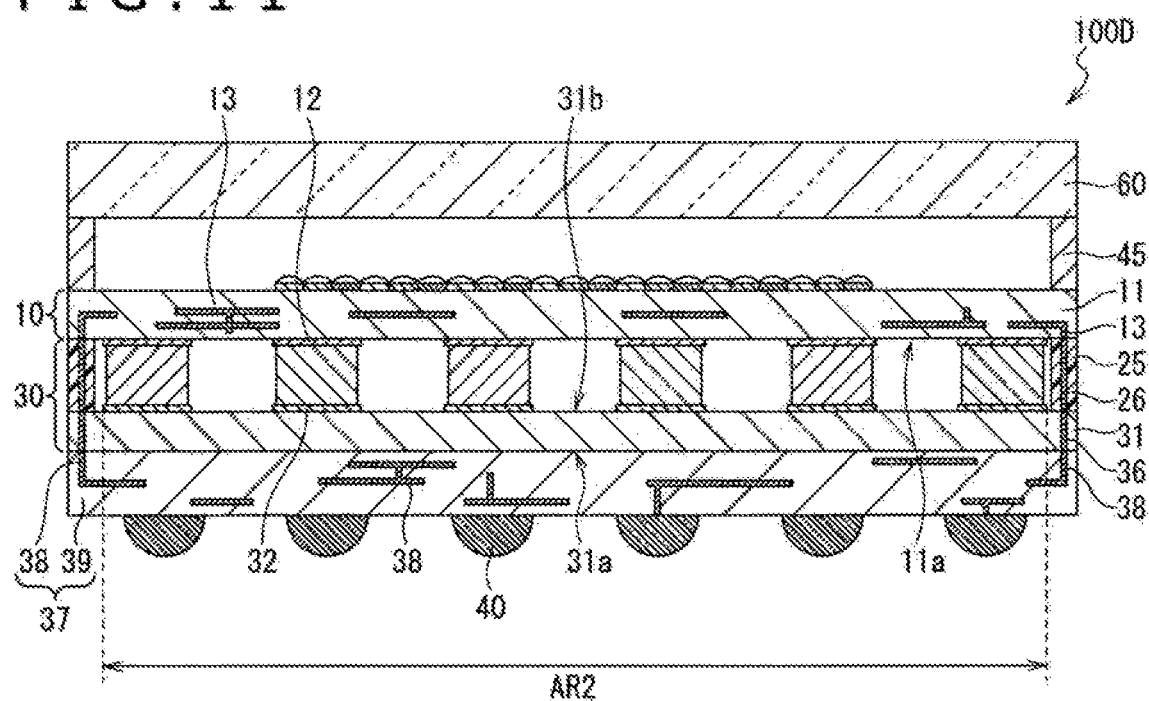
FIG. 11 is a cross-sectional view illustrating a configuration of a semiconductor apparatus according to a fourth variation of the first embodiment of the present disclosure.

FIG. 11 is a cross-sectional view illustrating a configuration of a semiconductor apparatus 100D according to a fourth variation of the first embodiment of the present disclosure. As illustrated in FIG. 11, the package format of the semiconductor apparatus 100D is a wafer-level chip size package. In the semiconductor apparatus 100D, a first spacer 25 with insulating properties is provided between the semiconductor substrate 11 and the lower substrate 31, and outside the region AR2 in which the thermoelectric semiconductor 33 is disposed. The first spacer 25 is an insulating frame that surrounds, in a plan view and without gaps, the region AR2 in which the thermoelectric semiconductor 33 is disposed. The first spacer 25 may include an insulating resin, or may include a ceramic. The upper end of the first spacer 25 is joined to the bottom surface 11a of the semiconductor substrate 11, and the lower end of the first spacer 25 is joined to the top surface 31b of the lower substrate 31.

Through wiring 26 which penetrates the first spacer 25 in the Z-axis direction (the thickness direction of the semiconductor apparatus 100) is provided inside the first spacer 25. The through wiring 26 includes a metal such as Cu, for example. The through wiring 26 is respectively connected to wiring 13 provided inside the semiconductor substrate 11, and through electrodes 36 which penetrate between the bottom surface 31a and the top surface 31b of the lower substrate 31. The through electrodes 36 include a metal such as Cu, for example.

A rewiring layer 37 (an example of a "second rewiring layer" in the present disclosure) is provided on bottom surface 31a side, which is the reverse side of the surface facing the semiconductor substrate 11, in the lower substrate 31. The rewiring layer 37 has, for example, wiring 38 provided in many layers, and an insulation layer 39 which insulates one layer of the wiring 38 from other layers of the wiring 38. The wiring 38 includes a metal such as Cu, for example. The insulation layer 39 includes a solder resist, for example. A plurality of bump electrodes 40 is provided on the bottommost surface of the rewiring layer 37. Each bump electrode 40 is connected to wiring 38. Each bump electrode 40 includes a solder ball, for example.

A second spacer 45 is provided between the top surface 11b of the semiconductor substrate 11 and the lid 60, and outside a region where the color filter layer 15 and the micro-lens layer 16 are disposed. The second spacer 45 is an insulating frame that surrounds, in a plan view and without gaps, the region in which the color filter layer 15 and the micro-lens layer 16 are disposed. For example, the second spacer 45 is provided so as to overlap with the first spacer 25 in the Z-axis direction, with the semiconductor substrate 11 therebetween. The second spacer 45 may include an insulating resin or may include a ceramic. The upper end of the second spacer 45 is joined to the lid 60, and the lower end of the second spacer 45 is joined to the top surface 11b of the semiconductor substrate 11.

In the semiconductor apparatus 100D, the space between the semiconductor substrate 11 and the lower substrate 31 is sealed, in an airtight manner, by the first spacer 25 which has a frame shape. In addition, the space between the semiconductor substrate 11 and the lid 60 is sealed, in an airtight manner, by the second spacer 45 which has a frame shape. An electrical connection between the semiconductor substrate 11 and the lower substrate 31 is performed via the through wiring 26 inside the first spacer 25 which is not a wire such as a gold wire. The semiconductor apparatus 100D is a wafer-level chip size package and does not require wires, and thus enables further thinning and miniaturization.

Note that the space which is between the semiconductor substrate 11 and the lid 60 and is surrounded by the second spacer 45 may be hollow or may be filled by a resin having translucency (in other words, a transparent resin).

Figure 12A:
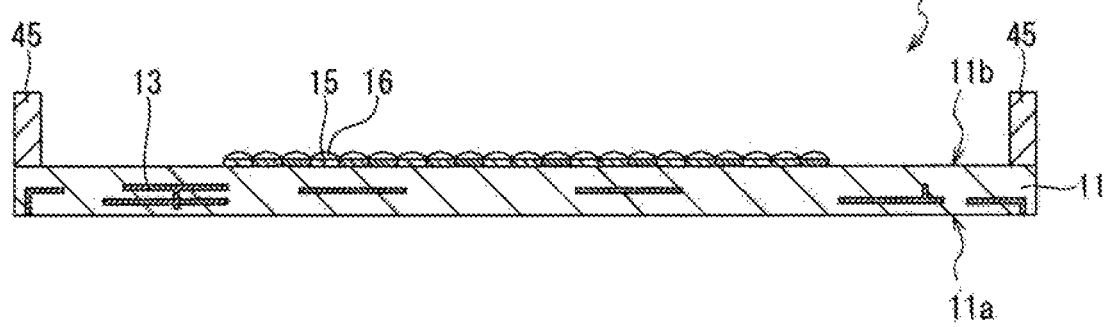
FIG. 12A is a cross-sectional view illustrating, in the order of steps, a method of manufacturing the semiconductor apparatus according to the fourth variation of the first embodiment of the present disclosure.

Next, description is given for a method of manufacturing the semiconductor apparatus 100D illustrated in FIG. 11. FIGS. 12A, 12B, 12C, 12D, 12E, and 12F are cross-sectional views illustrating, in the order of steps, the method of manufacturing the semiconductor apparatus 100D according to the fourth variation of the first embodiment of the present disclosure. In FIG. 12A, the method is the same as the manufacturing method described with reference to FIGS. 6A and 6B before a step for forming the sensor wafer 10' on which multiple units of the sensor element 10 are formed, and forming the through electrodes 22 in the sensor wafer 10'.

Figure 12B:
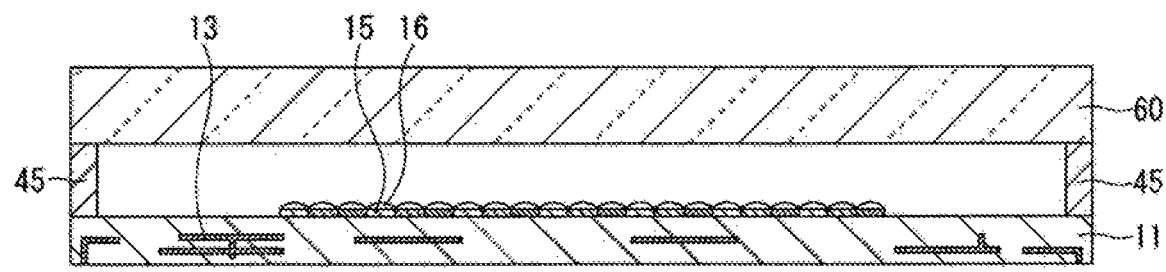
FIG. 12B is a cross-sectional view illustrating, in the order of steps, the method of manufacturing the semiconductor apparatus according to the fourth variation of the first embodiment of the present disclosure.

After the through electrodes 22 are formed, a manufacturing apparatus forms the second spacer 45 on the top surface 11b side of the sensor wafer 10'. The manufacturing apparatus may form the second spacer 45 using a wafer process or may attach a second spacer 45 which is prepared in advance on the top surface 11b side via an adhesive etc. Next, as illustrated in FIG. 12B, the manufacturing apparatus attaches the lid 60 onto the second spacer 45. As a result, the space between the semiconductor substrate 11 and the lid 60 is sealed in an airtight manner.

Figure 12C:
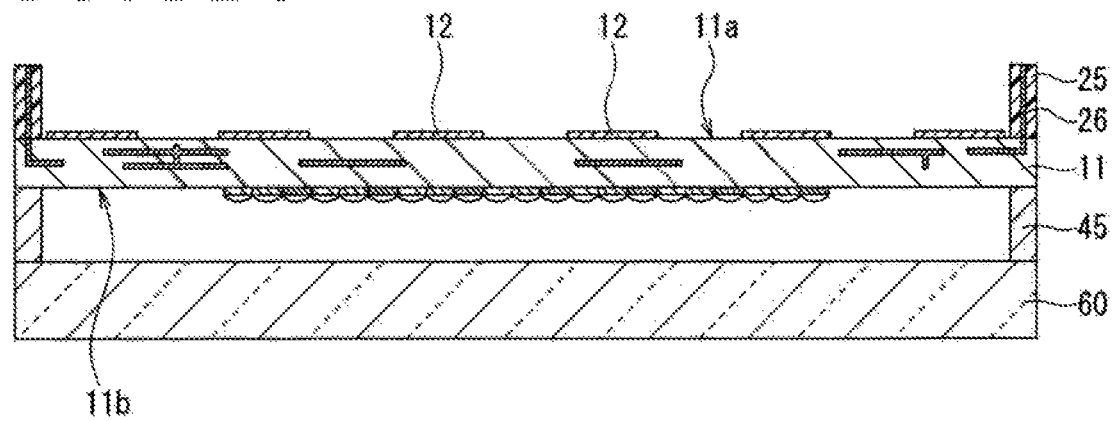
FIG. 12C is a cross-sectional view illustrating, in the order of steps, the method of manufacturing the semiconductor apparatus according to the fourth variation of the first embodiment of the present disclosure.

Next, as illustrated in FIG. 12C, the manufacturing apparatus horizontally inverts the semiconductor substrate 11 so that the lid 60 faces downward, and forms the first electrodes 12 on the bottom surface 11a side (upper side in FIG. 12C) of the semiconductor substrate 11. Next, the manufacturing apparatus forms the first spacer 25 on the bottom surface 11a side of the semiconductor substrate 11, and joins the through wiring 26 positioned inside the first spacer 25 with the through electrodes 22 in the semiconductor substrate 11.

Figure 12D:
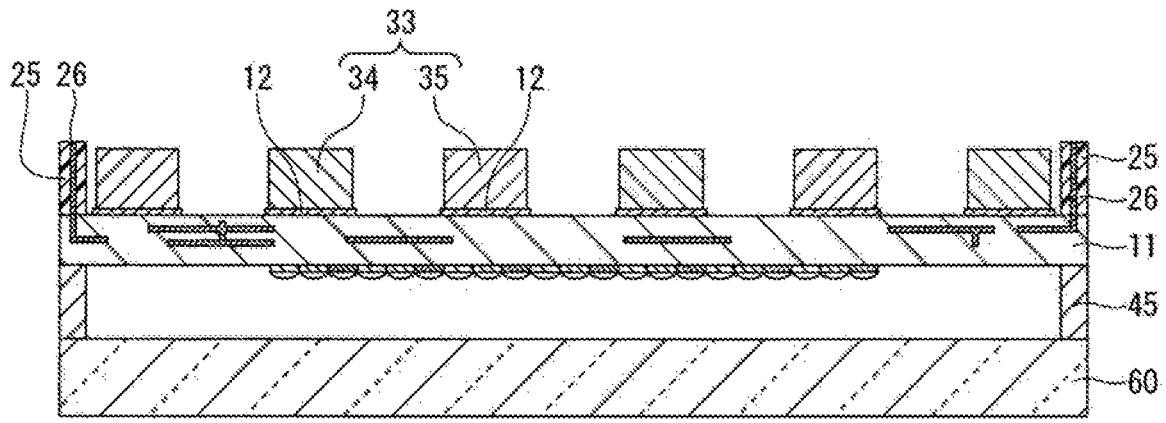
FIG. 12D is a cross-sectional view illustrating, in the order of steps, the method of manufacturing the semiconductor apparatus according to the fourth variation of the first embodiment of the present disclosure.
Figure 12E:
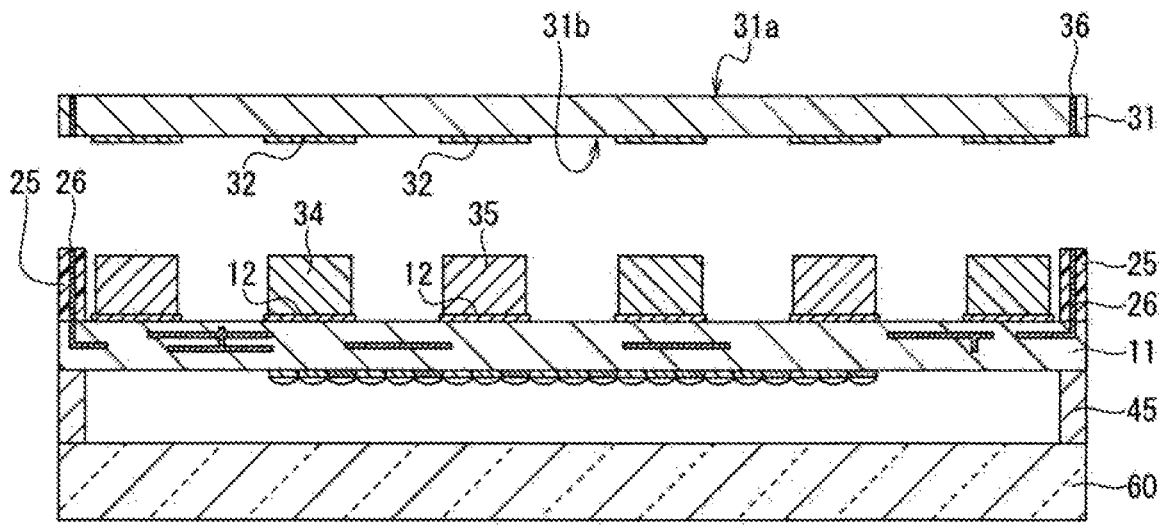
FIG. 12E is a cross-sectional view illustrating, in the order of steps, the method of manufacturing the semiconductor apparatus according to the fourth variation of the first embodiment of the present disclosure.

Next, as illustrated in FIG. 12D, the manufacturing apparatus attaches the P-type thermoelectric semiconductors 34 and the N-type thermoelectric semiconductors 35 onto the first electrodes 12. Next, as illustrated in FIG. 12E, the manufacturing apparatus faces the top surface 31b side of the lower substrate 31 downward, respectively joins the second electrodes 32 on the lower substrate 31 with the P-type thermoelectric semiconductors 34 and the N-type thermoelectric semiconductors 35, and joins the through electrodes 36 in the lower substrate 31 with the through wiring 26 positioned inside the first spacer 25.

Figure 12F:
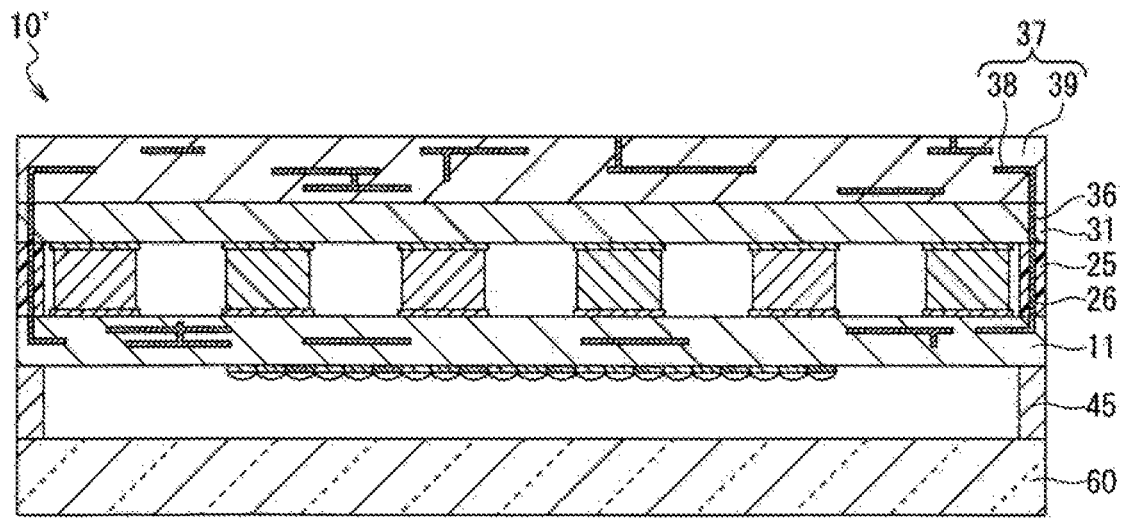
FIG. 12F is a cross-sectional view illustrating, in the order of steps, the method of manufacturing the semiconductor apparatus according to the fourth variation of the first embodiment of the present disclosure.

Next, as illustrated in FIG. 12F, the manufacturing apparatus forms the rewiring layer 37 on the bottom surface 31a side of the lower substrate 31. The manufacturing apparatus uses a semi-additive method or a subtractive method, for example, to form the rewiring layer 37. In addition, when forming the rewiring layer 37, the manufacturing apparatus connects the wiring 38 with the through electrodes 36 in the lower substrate 31. Subsequently, the manufacturing apparatus forms the plurality of bump electrodes 40 (refer to FIG. 11) on the bottommost surface of the rewiring layer 37 (the topmost surface in FIG. 12F). Subsequently, the sensor wafer 10' together with the lower substrate 31 are diced.

Through the above steps, the semiconductor apparatus 100E illustrated in FIG. 11 is completed.

(Fifth Variation)

Figure 13:
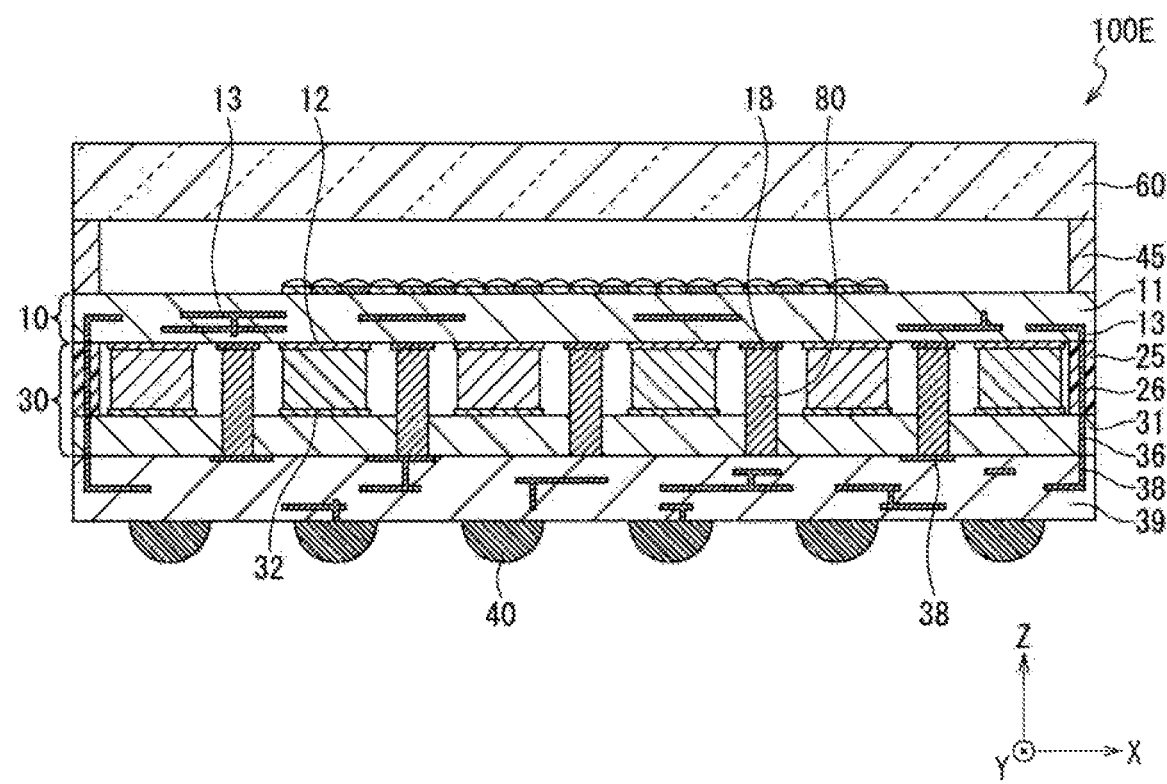
FIG. 13 is a cross-sectional view illustrating a configuration of a semiconductor apparatus according to a fifth variation of the first embodiment of the present disclosure.
Figure 14:
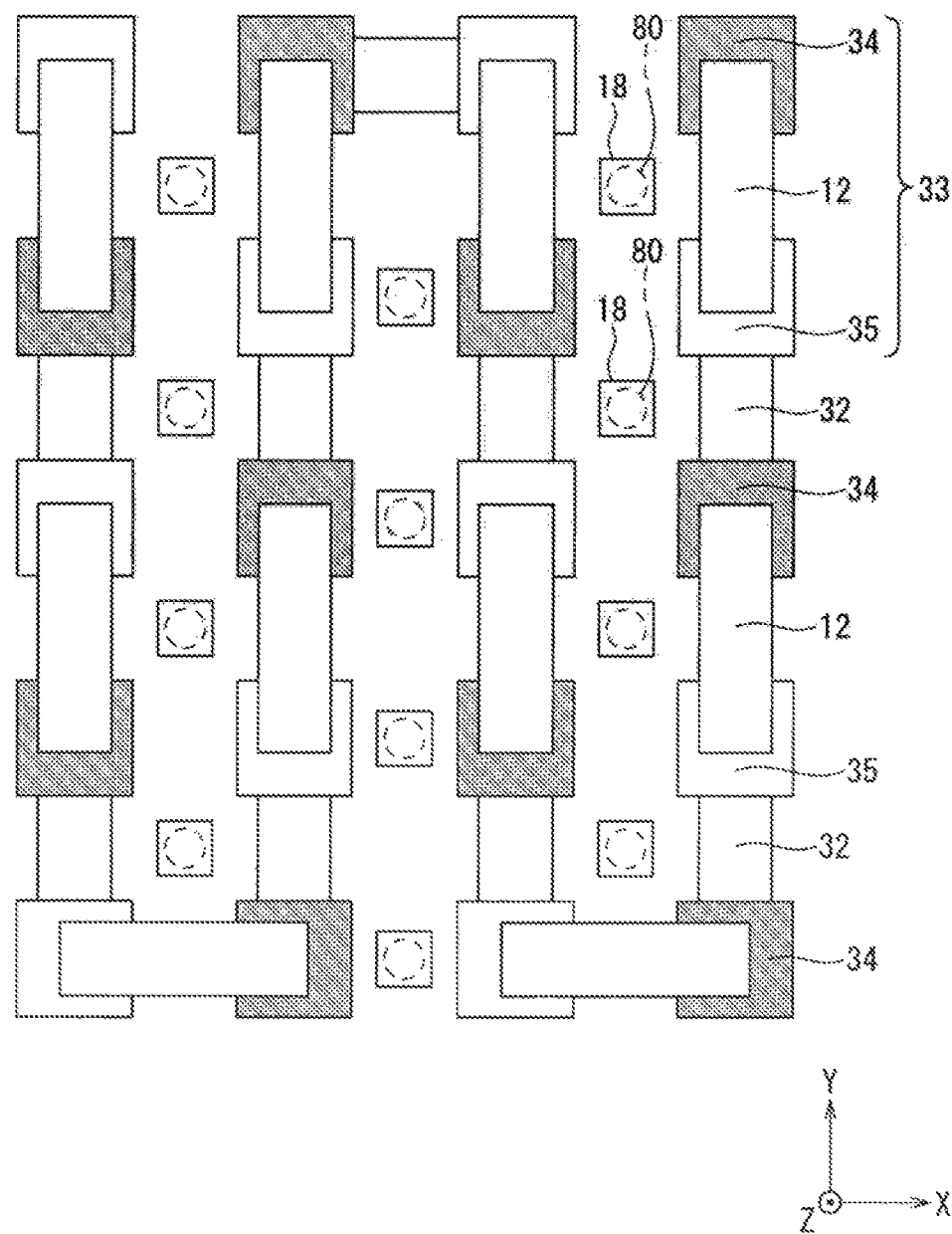
FIG. 14 is a plan view illustrating a disposition of electrical conductors according to the fifth variation of the first embodiment of the present disclosure.

FIG. 13 is a cross-sectional view illustrating a configuration of a semiconductor apparatus 100E according to a fifth variation of the first embodiment of the present disclosure. FIG. 14 is a plan view illustrating the disposition of electrical conductors 80 according to the fifth variation of the first embodiment of the present disclosure. As illustrated in FIG. 13 and FIG. 14, the semiconductor apparatus 100E is provided with electrical conductors 80, which are disposed between the P-type thermoelectric semiconductors 34 and the N-type thermoelectric semiconductors 35 and are each electrically separated from the P-type thermoelectric semiconductors 34 and the N-type thermoelectric semiconductors 35. The electrical conductors 80 are disposed adjacent to respective P-type thermoelectric semiconductors 34 and N-type thermoelectric semiconductors 35 with respective intervals.

The electrical conductors 80 are connecting terminals for connecting the semiconductor substrate 11 with the rewiring layer 37. The electrical conductors 80 penetrate between the top surface 31b and the bottom surface 31a of the lower substrate 31. Wiring 38 in the rewiring layer 37 is connected to the lower ends of the electrical conductors 80. In addition, electrodes 18 are provided on the bottom surface 11a side of the semiconductor substrate 11. The electrodes 18 are provided at positions separated from the first electrodes 12 and are electrically separated from the first electrodes 12. The upper ends of the electrical conductors 80 are connected to the electrodes 18. The electrical conductors 80 are connected to the semiconductor substrate 11 and the rewiring layer 37 via the electrodes 18.

In the semiconductor apparatus 100E, the electrical conductors 80 are used as signal lines or power supply lines between the semiconductor substrate 11 and the rewiring layer 37. The electrical conductors 80 are connected to the semiconductor substrate 11 and the rewiring layer 37 without bypassing the Peltier element 30. The semiconductor apparatus 100E enables the length of wiring between the semiconductor substrate 11 and the rewiring layer 37 to be shortened, and thus enables a reduction of impedance.

Note that, in the semiconductor apparatus 100E, an insulating resin may be filled between the semiconductor substrate 11 and the lower substrate 31. Because the electrical conductors 80 are supported in the horizontal direction (direction parallel to the X-Y plane) by the resin between the semiconductor substrate 11 and the lower substrate 31, the joint strength of the electrical conductors 80 with respect to the semiconductor substrate 11 and the lower substrate 31 improves.

In addition, similarly to a semiconductor apparatus 100G, in the semiconductor apparatus 100E, it is a case that the space which is between the semiconductor substrate 11 and the lid 60 and is surrounded by the second spacer 45 may be hollow or may be filled by a transparent resin.

(Sixth Variation)

In the above-described first embodiment and the first through fifth variations thereof, description is given for a case in which the semiconductor apparatus is a sensor apparatus provided with a color filter layer 15 and a microlens layer 16. However, in the first embodiment of the present disclosure, the semiconductor apparatus is not limited to a sensor apparatus. A semiconductor apparatus according to the first embodiment may be an integrated circuit (IC) or a large-scale integrated circuit (LSI), for executing an optionally-defined function.

Figure 15:
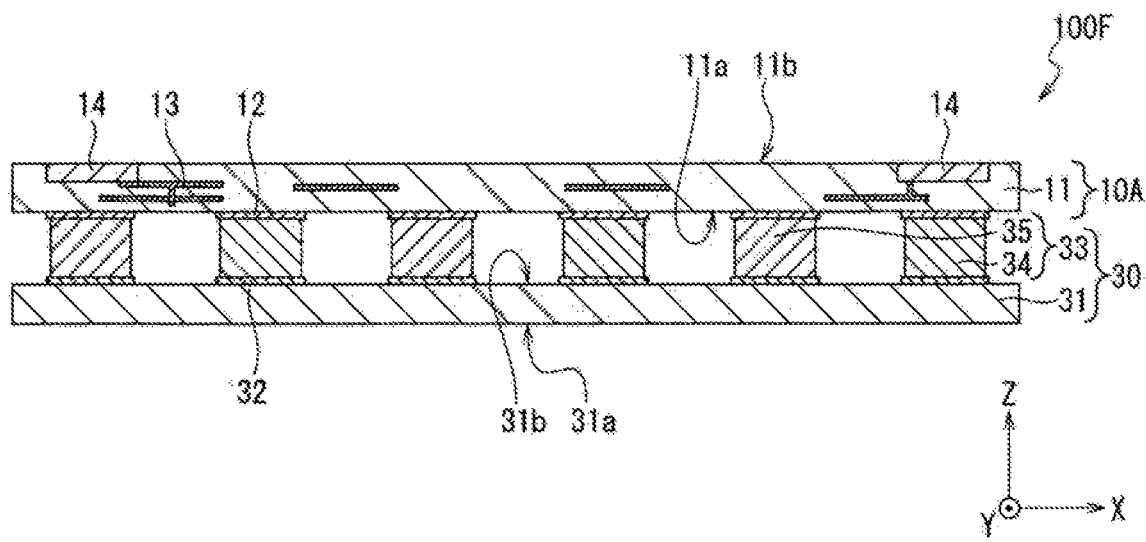
FIG. 15 is a cross-sectional view illustrating a configuration of a semiconductor apparatus according to a sixth variation of the first embodiment of the present disclosure.

FIG. 15 is a cross-sectional view illustrating a configuration of a semiconductor apparatus 100F according to a sixth variation of the first embodiment of the present disclosure. The semiconductor apparatus 100F illustrated in FIG. 15 is an IC or an LSI, and is provided with an IC element 10A and a Peltier element 30. The IC element 10A may be referred to as an IC chip. The IC element 10A is provided with a semiconductor substrate 11, first electrodes 12 provided on a bottom surface 11a side of the semiconductor substrate 11, external connection terminals 14 provided on a top surface 11b side of the semiconductor substrate 11, and a plurality of pieces of wiring 13 provided in many layers inside the semiconductor substrate 11. The Peltier element 30 has the lower substrate 31 and the thermoelectric semiconductor 33 which is disposed between the lower substrate 31 and the semiconductor substrate 11.

Similarly to the semiconductor apparatus 100 illustrated in FIG. 1 and FIG. 2, it is a case that, also in the semiconductor apparatus 100F, the first electrodes 12 on the semiconductor substrate 11 and the second electrodes 32 on the lower substrate 31 are each connected to the thermoelectric semiconductor 33. The semiconductor substrate 11 is not only used as a substrate for the semiconductor apparatus 100F but is also used as an upper substrate for the Peltier element 30.

It is a case that, also in the semiconductor apparatus 100F, the semiconductor substrate 11 also serves as the upper substrate for the Peltier element 30. The Peltier element 30 is integrated with the semiconductor substrate 11, and it is possible to reduce the number of components. As a result, the semiconductor apparatus 100F enables to reduce the thickness, and enables miniaturization.

(Seventh Variation)

Figure 16:
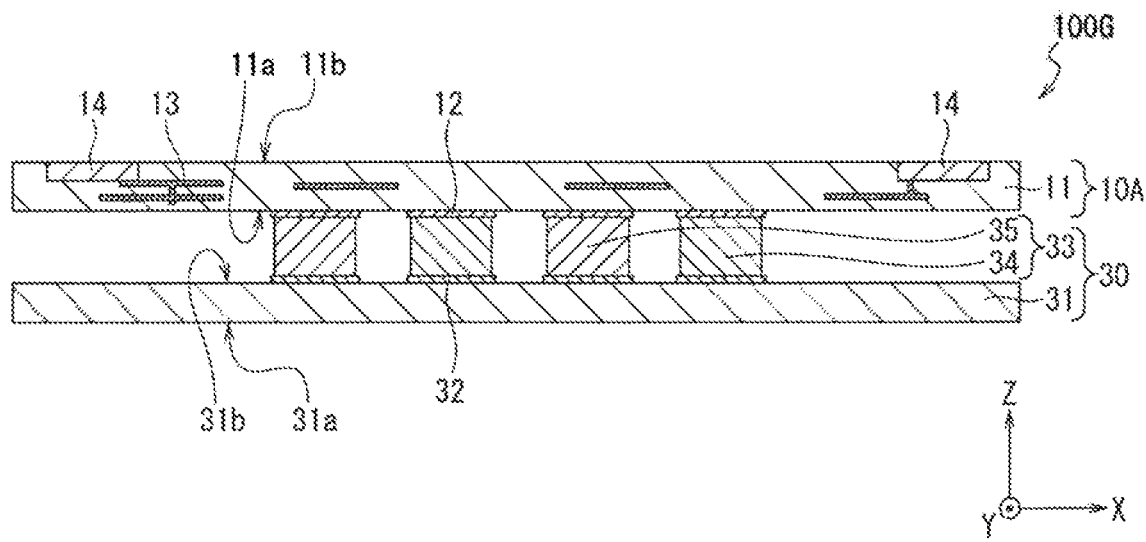
FIG. 16 is a cross-sectional view illustrating a configuration of a semiconductor apparatus according to a seventh variation of the first embodiment of the present disclosure.

FIG. 16 is a cross-sectional view illustrating a configuration of a semiconductor apparatus 100G according to a seventh variation of the first embodiment of the present disclosure. As illustrated in FIG. 16, in the semiconductor apparatus 100G, the thermoelectric semiconductor 33 is disposed below the center of the semiconductor substrate 11, but the thermoelectric semiconductor 33 is not disposed below the periphery of the semiconductor substrate 11. The thermoelectric semiconductor 33 is disposed biased to below the center of the semiconductor substrate 11.

Even with such a configuration, in a case where the semiconductor substrate 11 is a silicon substrate, silicon has superior thermal conductivity, and thus it is possible to achieve a sufficient cooling effect. In addition, by disposing the thermoelectric semiconductor 33 biased to below the center of the semiconductor substrate 11, an open space arises below the perimeter of the semiconductor substrate 11. For example, the electrical conductors 80 illustrated in FIG. 13 may be provided in this open space. By effectively using this open space, for example, it is possible to have more signal lines while increasing the size of the semiconductor apparatus 100G is being avoided, and higher performance is also possible.

(Eighth Variation)

Figure 17:
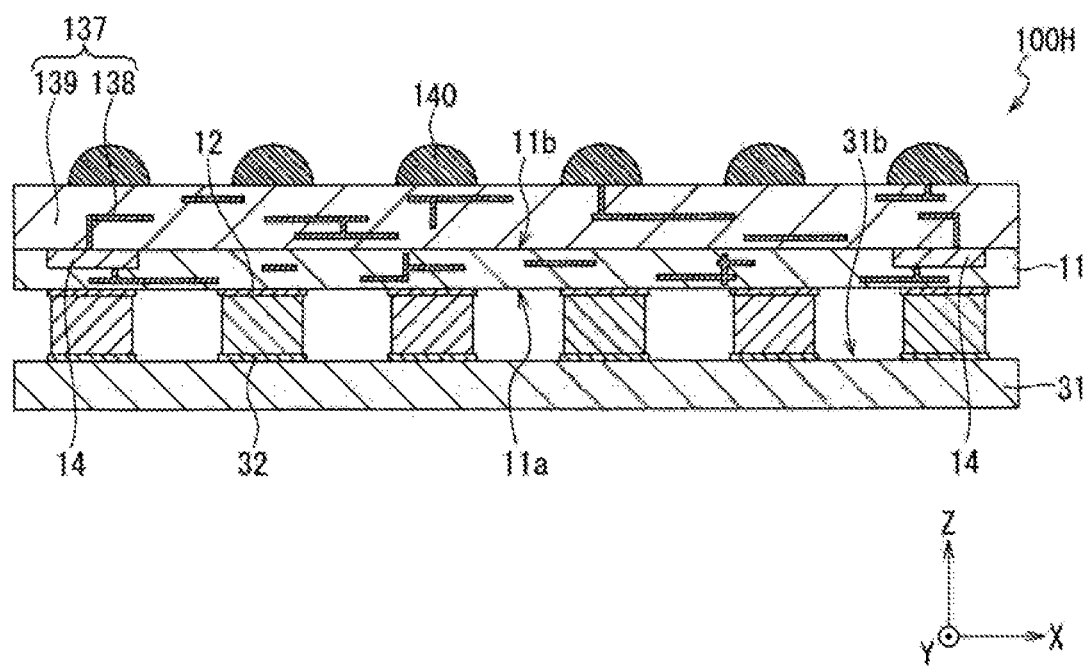
FIG. 17 is a cross-sectional view illustrating a configuration of a semiconductor apparatus according to an eighth variation of the first embodiment of the present disclosure.

FIG. 17 is a cross-sectional view illustrating a configuration of a semiconductor apparatus 100H according to an eighth variation of the first embodiment of the present disclosure. The semiconductor apparatus 100H illustrated in FIG. 17 is an aspect resulting from providing the rewiring layer 37 and the bump electrodes 40 in the semiconductor apparatus 100F illustrated in FIG. 15. As illustrated in FIG. 17, the semiconductor apparatus 100H is provided with a rewiring layer 137 (an example of a "first rewiring layer" in the present disclosure) on the top surface 11b side, which is the reverse side of the surface facing the lower substrate 31, of the semiconductor substrate 11. The rewiring layer 137 has, for example, wiring 138 provided in many layers, and an insulation layer 139 which insulates one layer of the wiring 138 from other layers of the wiring 138. In addition, a plurality of bump electrodes 140 is provided on the topmost surface of the rewiring layer 137. Each bump electrode 140 is connected to the wiring 138. Each bump electrode 140 include a solder ball, for example. In the semiconductor apparatus 100H, it is possible to supply a current to the Peltier element 30 via the bump electrodes 140.

(Ninth Variation)

Figure 18:
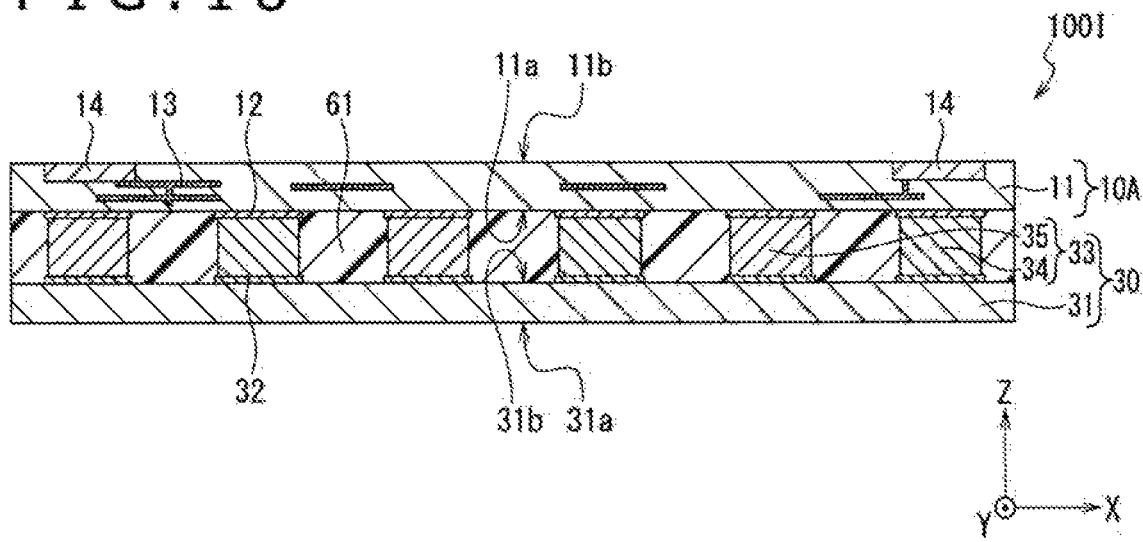
FIG. 18 is a cross-sectional view illustrating a configuration of a semiconductor apparatus according to a ninth variation of the first embodiment of the present disclosure.

FIG. 18 is a cross-sectional view illustrating a configuration of a semiconductor apparatus 100I according to a ninth variation of the first embodiment of the present disclosure. As illustrated in FIG. 18, in the semiconductor apparatus 100I, an insulating resin 61 is filled between the semiconductor substrate 11 and the lower substrate 31. By the resin 61, between the semiconductor substrate 11 and the lower substrate 31 is sealed without gaps. The resin 61 is in close contact with the side surfaces of the thermoelectric semiconductor 33 and prevents the thermoelectric semiconductor from being exposed to outside air or moisture. In addition, the resin 61 supports the thermoelectric semiconductor 33 in the horizontal direction (direction parallel to the X-Y plane). As a result, improving the joint strength of the thermoelectric semiconductor 33 with respect to the semiconductor substrate 11 and the lower substrate 31 is addressed.

(Tenth Variation)

Figure 19:
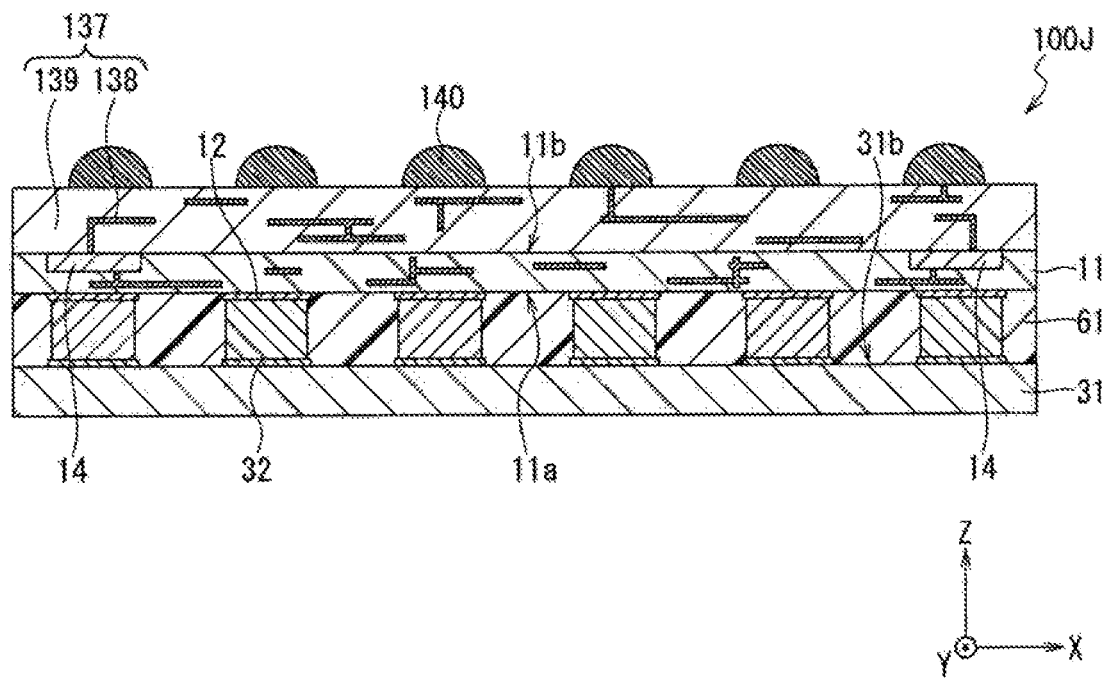
FIG. 19 is a cross-sectional view illustrating a configuration of a semiconductor apparatus according to a tenth variation of the first embodiment of the present disclosure.

FIG. 19 is a cross-sectional view illustrating a configuration of a semiconductor apparatus 100J according to a tenth variation of the first embodiment of the present disclosure. The semiconductor apparatus 100J illustrated in FIG. 19 is an aspect resulting from providing the rewiring layer 137 and the bump electrodes 140 in the semiconductor apparatus 100I illustrated in FIG. 18. In the semiconductor apparatus 100J, it is possible to supply a current to the Peltier element 30 via the bump electrodes 140.

(Eleventh Variation)

Figure 20:
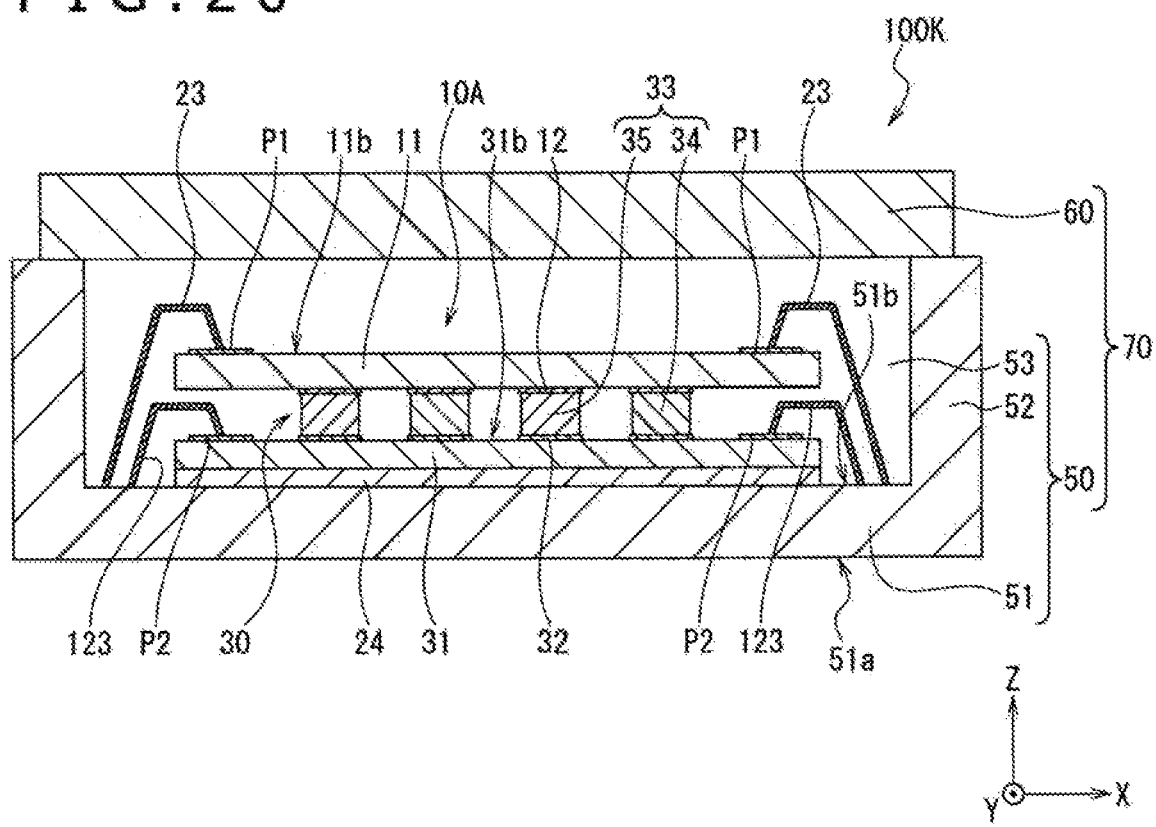
FIG. 20 is a cross-sectional view illustrating a configuration of a semiconductor apparatus according to an eleventh variation of the first embodiment of the present disclosure.

FIG. 20 is a cross-sectional view illustrating a configuration of a semiconductor apparatus 100K according to an eleventh variation of the first embodiment of the present disclosure. As illustrated in FIG. 20, a semiconductor apparatus 100K is provided with a package body 50, and a lid 60 attached to a top surface side of the package body 50. A package 70 includes the package body 50 and the lid 60.

In the semiconductor apparatus 100K, the IC element 10A and the Peltier element 30 are disposed and sealed, in an airtight manner, in a space 53 inside the package 70. As a result, the semiconductor apparatus 100K can suppress foreign matter adhering to the IC element 10A, and can reduce the possibility of the foreign matter causing an impact on the operation of the IC element 10A.

Second Embodiment

In the above-described first embodiment and variations thereof, description is given for aspects in which a semiconductor substrate in which a sensor element or an IC element is formed also serves as an upper substrate for a Peltier element. However, embodiments of the present disclosure are not limited to this. In embodiments of the present disclosure, a wiring substrate may also serve as a lower substrate for a Peltier element.

(Configuration)

Figure 21:
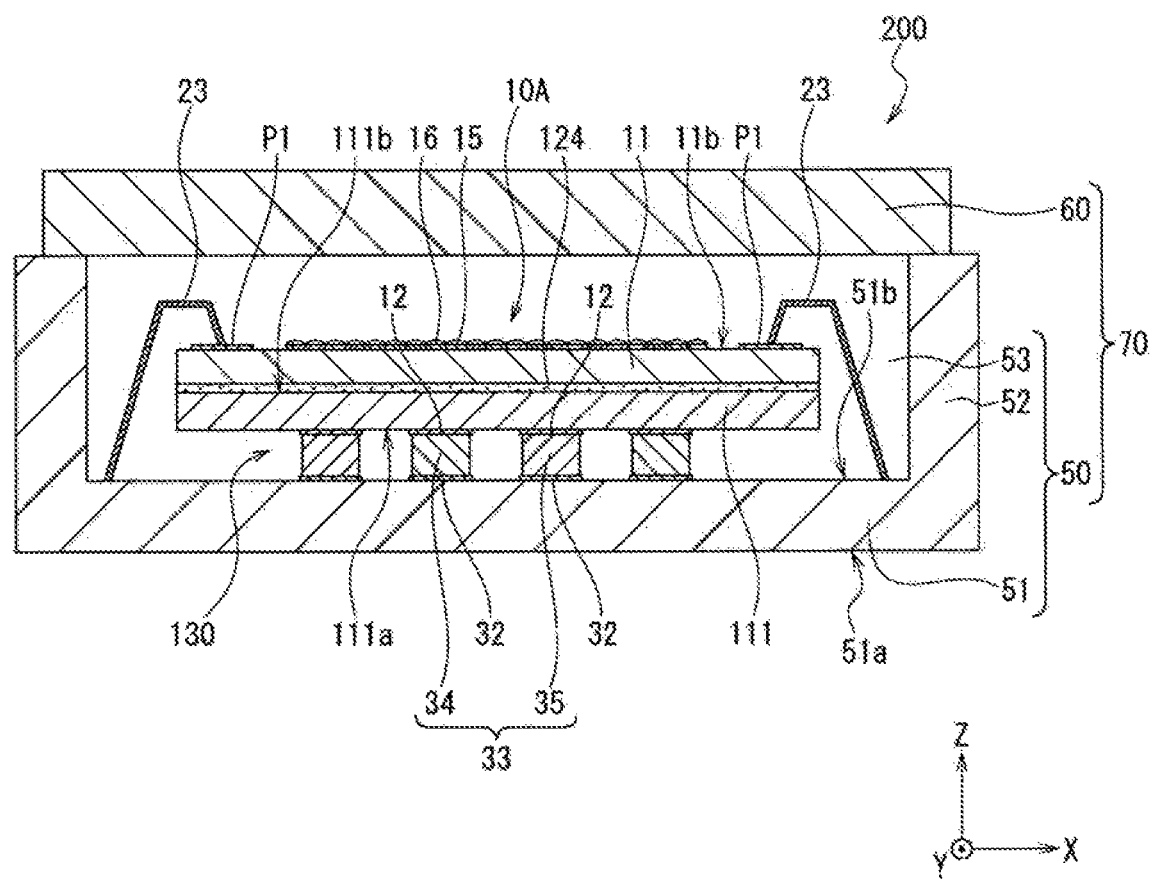
FIG. 21 is a cross-sectional view illustrating an example of a configuration of a semiconductor apparatus according to a second embodiment of the present disclosure.

FIG. 21 is a cross-sectional view illustrating an example of the configuration of a semiconductor apparatus 200 according to a second embodiment of the present disclosure. The semiconductor apparatus 200 illustrated in FIG. 21 is, for example, a sensor apparatus and is provided with a sensor element 10, a Peltier element 130, and a package 70. As described above, the sensor element 10 is a CMOS image sensor or a CCD image sensor, for example.

The Peltier element 130 has an upper substrate 111 (an example of a "second substrate" in the present disclosure) and the thermoelectric semiconductor 33 which is disposed between the upper substrate 111 and a wiring substrate. The upper substrate 111 is a ceramic substrate, for example. In the semiconductor apparatus 200, first electrodes 12 are provided on the bottom surface 111a side of the upper substrate 111.

A top surface 111b of the upper substrate 111 is fixed to the bottom surface 11a of the semiconductor substrate 11 via a die bond material 124. Bonding pads P1 for connecting to the sensor element 10 are provided on a top surface 111b side of the semiconductor substrate 11. A wire 23 is joined to each bonding pad P1. For the sensor element 10, input and output of a power supply or signals is possible via the bonding pads P1 and the wires 23.

The package 70 is provided with a package body 50 and a lid 60 attached to the top surface side of the package body 50. By the package body 50 and the lid 60, the sensor element 10 and the Peltier element 130 are sealed in an airtight manner. The package body 50 has a bottom 51 (an example of a "wiring substrate" in the present disclosure) onto which the thermoelectric semiconductor 33 in the Peltier element 130 is attached, and walls 52 disposed at the perimeter of the bottom 51. For example, the bottom 51 and the walls 52 are integrally formed. The sensor element 10 and the Peltier element 130 are disposed in a space 53 which is inside the package 70 and is surrounded by the bottom 51 and the walls 52.

In the semiconductor apparatus 200, second electrodes 32 are provided on a top surface 51b side of the bottom 51 of the package body 50. The first electrodes 12 provided on the upper substrate 111 and the second electrodes 32 provided on the bottom 51 are respectively connected to the thermoelectric semiconductor 33. The bottom 51 is not only used as a portion of the package body 50 but is also used as a lower substrate for a Peltier element 30A (as a substrate disposed sandwiching the thermoelectric semiconductor 33 on a reverse side of the upper substrate 111, that is, as a substrate for, together with the upper substrate 111, sandwiching the thermoelectric semiconductor 33).

In addition, wiring (not illustrated) for inputting and outputting a current to and from the Peltier element 130 is provided on the top surface 51b side of the bottom 51. This wiring is connected to the second electrodes 32. This wiring is formed at the same time at the second electrodes 32 in the same process, for example.

Figure 22A:
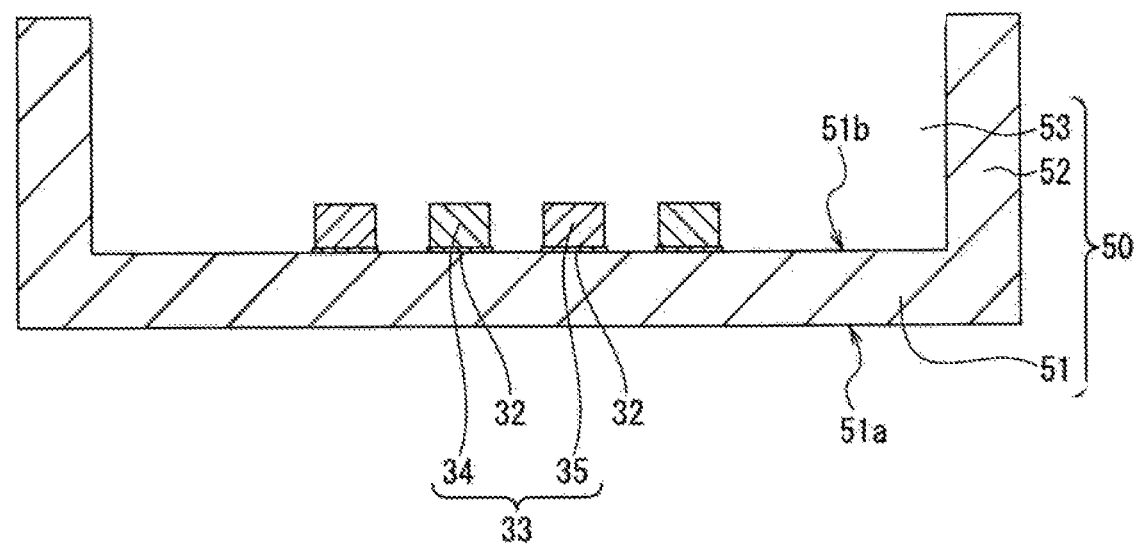
FIG. 22A is a cross-sectional view illustrating a method of manufacturing the semiconductor apparatus according to the second embodiment of the present disclosure.
Figure 22D:
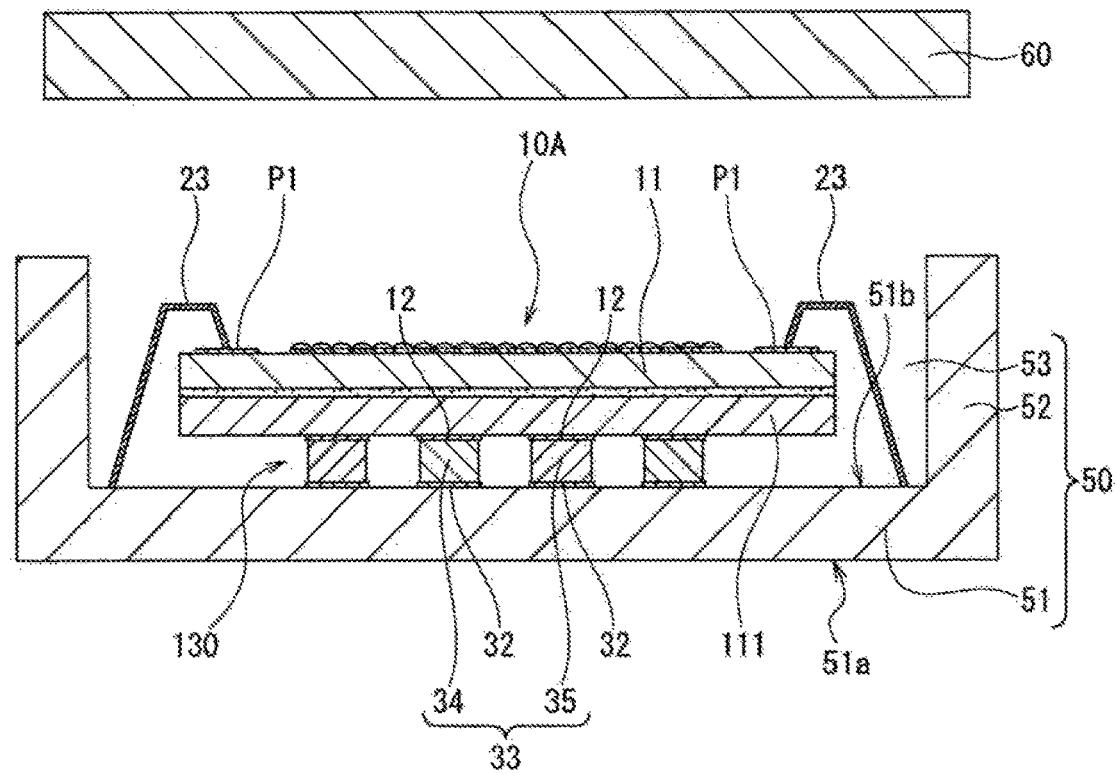
FIG. 22D is a cross-sectional view illustrating the method of manufacturing the semiconductor apparatus according to the second embodiment of the present disclosure.

(Manufacturing method) Next, description is given regarding a method of manufacturing the semiconductor apparatus 200 illustrated in FIG. 21. FIGS. 22A, 22B, 22C, and 22D are cross-sectional views that illustrate a method of manufacturing the semiconductor apparatus 200 according to the second embodiment of the present disclosure. As illustrated in FIG. 22A, a manufacturing apparatus forms the second electrodes 32 on the top surface 51b side of the bottom 51 of the package body 50, and forms wiring (not illustrated) for inputting and outputting a current to and from the Peltier element 130. Next, the manufacturing apparatus attaches P-type thermoelectric semiconductors 34 and N-type thermoelectric semiconductors 35 onto the second electrodes 32.

Next, as illustrated in FIG. 22B, the manufacturing apparatus attaches the upper substrate 111 onto the P-type thermoelectric semiconductors 34 and the N-type thermoelectric semiconductors 35. In a step for attaching the upper substrate 111, the first electrodes 12 provided on the bottom surface 111a side of the upper substrate 111 are respectively joined with the P-type thermoelectric semiconductors 34 and the N-type thermoelectric semiconductors 35.

Next, as illustrated in FIG. 22C, the manufacturing apparatus prepares the semiconductor substrate 11 onto which the color filter layer 15, the micro-lens layer 16, and the bonding pads P1 have been formed on the top surface 1ib side. The manufacturing apparatus then attaches the bottom surface 11a side of the semiconductor substrate 11 to the top surface 111b side of the upper substrate 111 via the die bond material 124. Next, the manufacturing apparatus connects, by the wires 23, bonding pads P1 on the sensor element 10 with bonding pads (not illustrated) provided on the top surface 51b side of the bottom 51.

Next, as illustrated in FIG. 12D, the manufacturing apparatus attaches the lid 60 to the walls 52 of the package body 50. As a result, the space 53 between the lid 60 and the package body 50 is sealed in an airtight manner. Through the above steps, the semiconductor apparatus 200 illustrated in FIG. 21 is completed.

As described above, the semiconductor apparatus 200 according to the second embodiment of the present disclosure is provided with a semiconductor substrate 11 and a Peltier element 130 disposed facing the semiconductor substrate 11. The Peltier element 130 has the upper substrate 111, and the thermoelectric semiconductor 33 disposed between the bottom 51 of the package body 50 and the upper substrate 111. The upper substrate 111 has the first electrodes 12 which are provided on the bottom surface 111a side facing the bottom 51 of the package body 50. The bottom 51 of the package body 50 has the second electrodes 32 which are provided on the top surface 111b side facing the upper substrate 111. The first electrodes 12 and the second electrodes 32 are each connected to the thermoelectric semiconductor 33.

As a result, the bottom 51 of the package body 50 can also serve as the lower substrate (as a substrate disposed sandwiching the thermoelectric semiconductor on a reverse side of the upper substrate 111, that is, as a substrate for, together with the upper substrate 111, sandwiching the thermoelectric semiconductor) for the Peltier element 130. It is possible to integrate the Peltier element 130 with the bottom 51, and it is possible to reduce the number of components for the semiconductor apparatus 200. As a result, it is possible to reduce the thickness (reduce the profile) of the semiconductor apparatus 200, and it is possible to miniaturize the semiconductor apparatus 200.

In addition, by integrating the Peltier element 130 and the bottom 51, heat exhaust efficiency from the Peltier element 130 to the bottom 51 improves. Because there is no substrate (lower substrate) for supporting the thermoelectric semiconductor 33 between Peltier element 130 and the bottom 51, heat exhaust from the Peltier element 130 to the bottom 51 is performed with good efficiency. As a result, the Peltier element 130 can improve cooling performance with respect to the semiconductor substrate 11.

In addition, input and output of a current to and from the Peltier element 130 is via wiring which provided on the bottom 51 and not dedicated Peltier element lead-out wiring which is led out to the outside of the semiconductor substrate 11. Because dedicated Peltier element lead-out wiring is unnecessary, a further space reduction is possible. As a result, further miniaturization of the semiconductor apparatus 200 is possible.

In addition, a lower substrate for the Peltier element 30 and an adhesive for joining dedicated Peltier element lead-out wiring and the lower substrate with the bottom are unnecessary, and thus it is possible to reduce the number of components. As a result, it is possible to address lowering costs for the semiconductor apparatus 200.

In addition, because there is no adhesive resin or lower substrate between the thermoelectric semiconductor 33 and the bottom 51, it is possible to suppress warping of the semiconductor substrate 11. In other words, a typical resin has a higher coefficient of linear expansion than an adhesive base material or a device, and therefore expands/contracts and undergoes changes in elastic modulus in accordance with temperature. Accordingly, a typical resin is likely to be a cause of warping of the semiconductor substrate 11. However, because there is no adhesive resin between the thermoelectric semiconductor 33 and the bottom 51 in the semiconductor apparatus 200, it is possible to suppress warping of the semiconductor substrate 11.

(First Variation)

Figure 23:
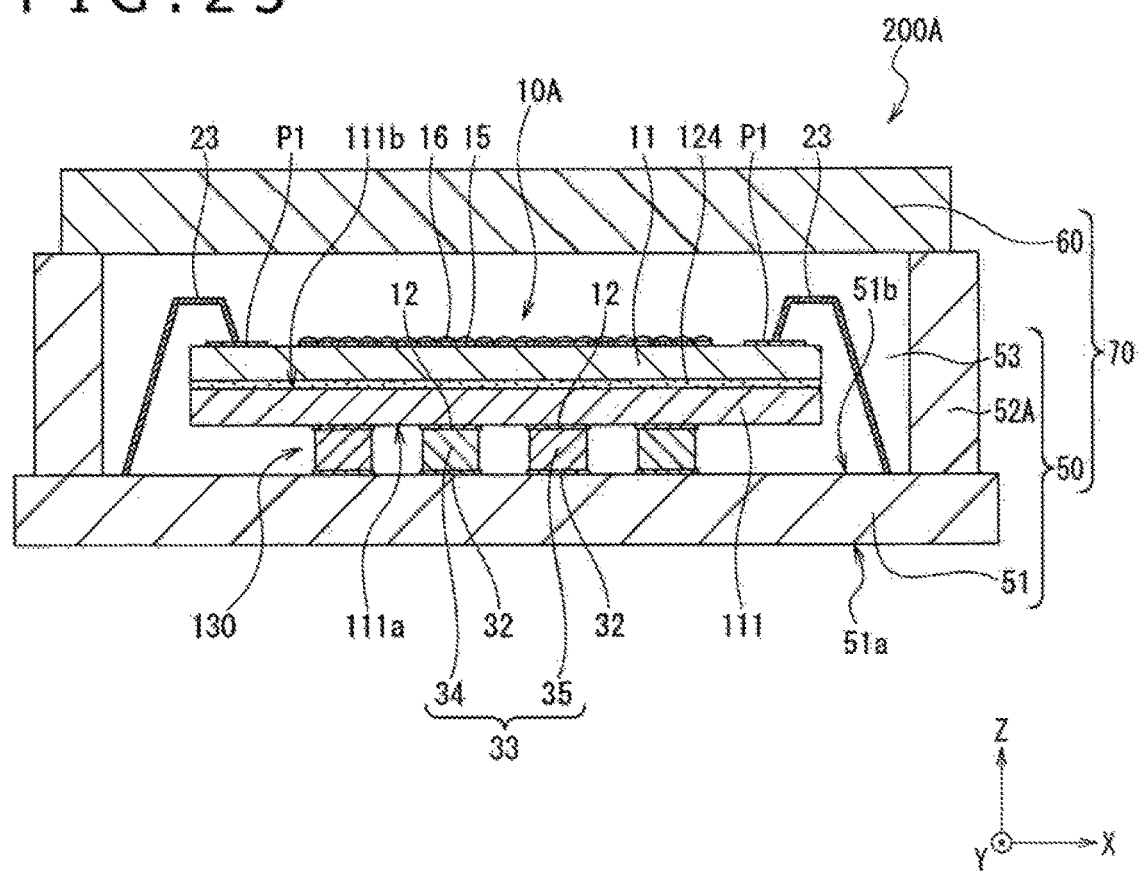
FIG. 23 is a cross-sectional view illustrating a configuration of a semiconductor apparatus according to a first variation of the second embodiment of the present disclosure.

FIG. 23 is a cross-sectional view illustrating a configuration of a semiconductor apparatus 200A according to a first variation of the second embodiment of the present disclosure. For the semiconductor apparatus 200A illustrated in FIG. 23, a difference with the semiconductor apparatus 200 illustrated in FIG. 19 is the structure of the package body 50. The package body 50 included in the semiconductor apparatus 200A has a bottom 51 onto which the lower substrate 31 of the Peltier element 30 is attached via a die bond material 24, and walls 52A disposed at the perimeter of the bottom 51. The bottom 51 and the walls 52A are separately formed, and include mutually different materials, for example. To give an example, the bottom 51 includes a ceramic, whereas the walls 52A include a resin or a metal. The bottom 51 and the walls 52As are joined to each other via an adhesive (not illustrated), for example.

The semiconductor apparatus 200A achieves a similar effect to that of the semiconductor apparatus 200 described above. In addition, as described in a manufacturing method described below, before attaching the walls 52A at the perimeter of the bottom 51, it is possible to attach a Peltier element 30A and the sensor element 10 onto the top surface 51b side of the bottom 51. At the time of attaching the sensor element 10, the walls 52As are not present on the top surface 51b side of the bottom 51 and the top surface 51b of the bottom 51 is flat. Therefore, attaching the Peltier element 30A and the sensor element 10 is easier. Accordingly, for the semiconductor apparatus 200A, it is possible to be able to improve productivity in comparison to the semiconductor apparatus 200.

Figure 24A:
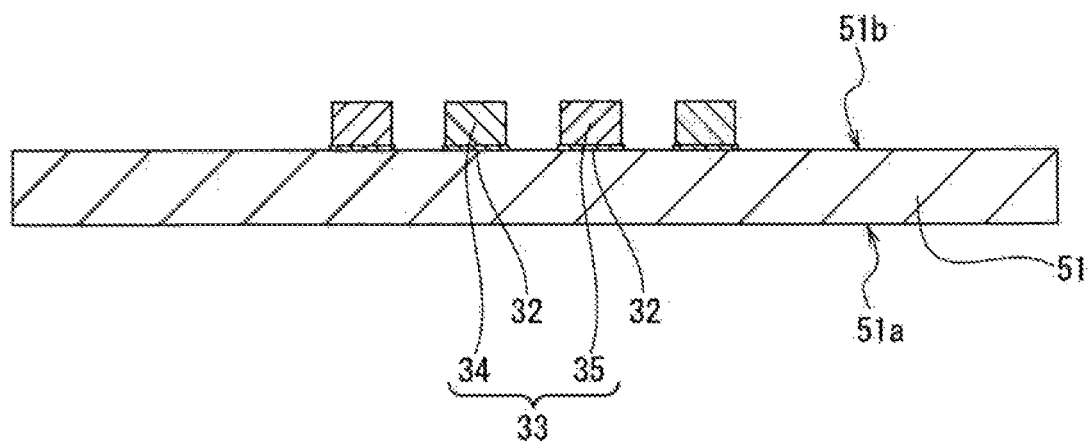
FIG. 24A is a cross-sectional view illustrating, in the order of steps, a method of manufacturing the semiconductor apparatus according to the first variation of the second embodiment of the present disclosure.

Next, description is given for a method of manufacturing the semiconductor apparatus 200A. FIGS. 24A, 24B, 24C, and 24D are cross-sectional views illustrating, in the order of steps, the method of manufacturing the semiconductor apparatus 200A according to the first variation of the second embodiment of the present disclosure. As illustrated in FIG. 24A, a manufacturing apparatus forms the second electrodes 32 on the top surface 51b side of the bottom 51, and forms wiring (not illustrated) for inputting and outputting a current to and from the Peltier element 130. Next, the manufacturing apparatus attaches P-type thermoelectric semiconductors 34 and N-type thermoelectric semiconductors 35 onto the second electrodes 32.

Figure 24B:
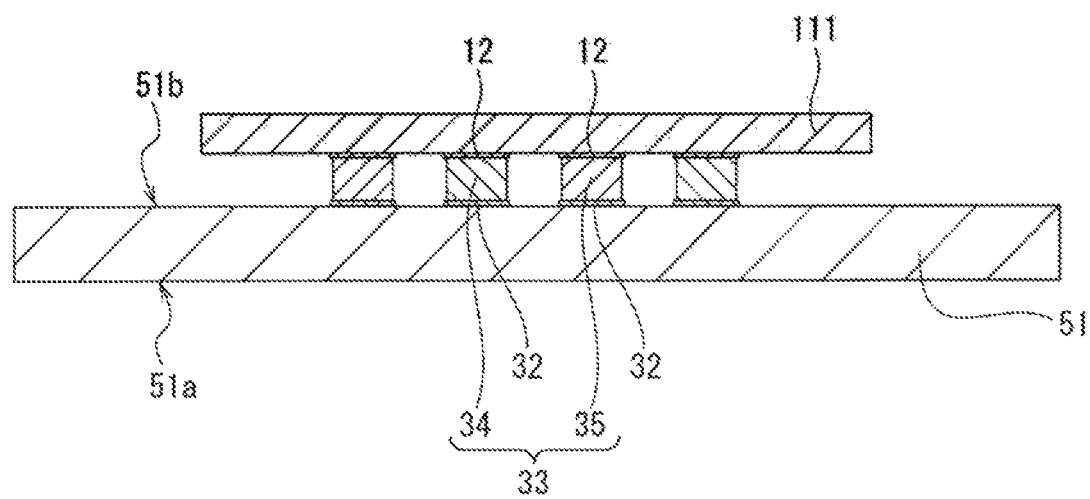
FIG. 24B is a cross-sectional view illustrating, in the order of steps, the method of manufacturing the semiconductor apparatus according to the first variation of the second embodiment of the present disclosure.

Next, as illustrated in FIG. 24B, the manufacturing apparatus attaches the upper substrate 111 onto the P-type thermoelectric semiconductors 34 and the N-type thermoelectric semiconductors 35. In a step for attaching the upper substrate 111, the first electrodes 12 provided on the bottom surface 111a side of the upper substrate 111 are respectively joined with the P-type thermoelectric semiconductors 34 and the N-type thermoelectric semiconductors 35.

Figure 24C:
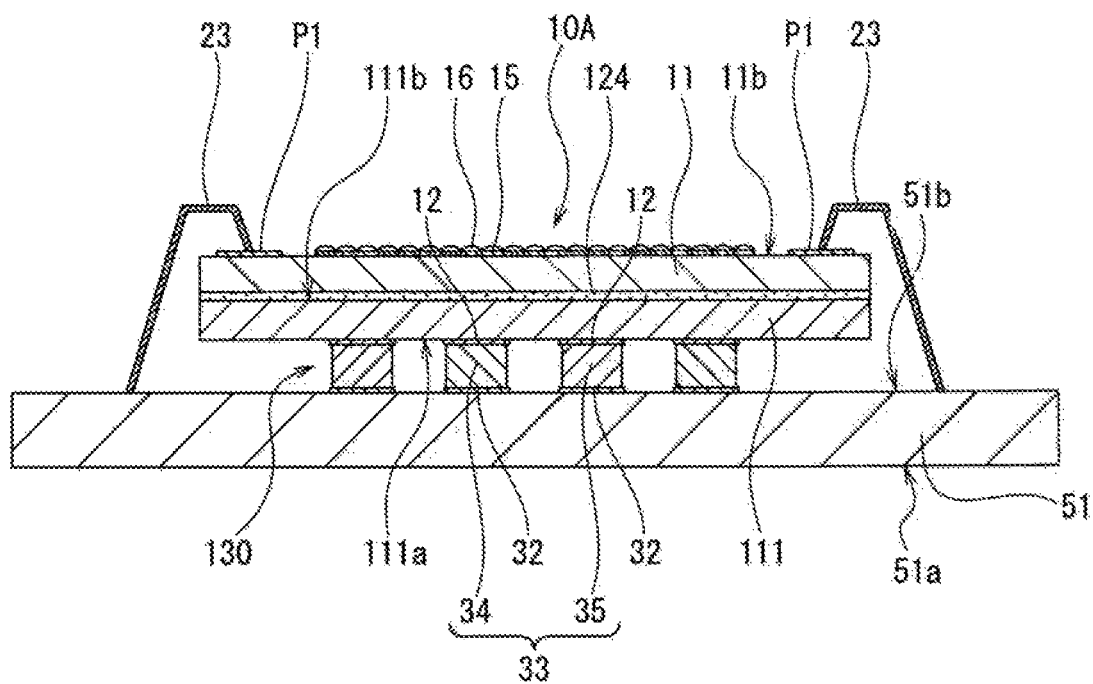
FIG. 24C is a cross-sectional view illustrating, in the order of steps, the method of manufacturing the semiconductor apparatus according to the first variation of the second embodiment of the present disclosure.

Next, as illustrated in FIG. 24C, the manufacturing apparatus prepares the semiconductor substrate 11 onto which the color filter layer 15 and the micro-lens layer 16 have been formed on the top surface 11b side. The manufacturing apparatus then attaches the bottom surface 11a side of the semiconductor substrate 11 to the top surface 111b side of the upper substrate 111 via the die bond material 124. Next, the manufacturing apparatus connects, by the wires 23, bonding pads P1 on the sensor element 10 with bonding pads (not illustrated) provided on the top surface 51b side of the bottom 51.

Figure 24D:
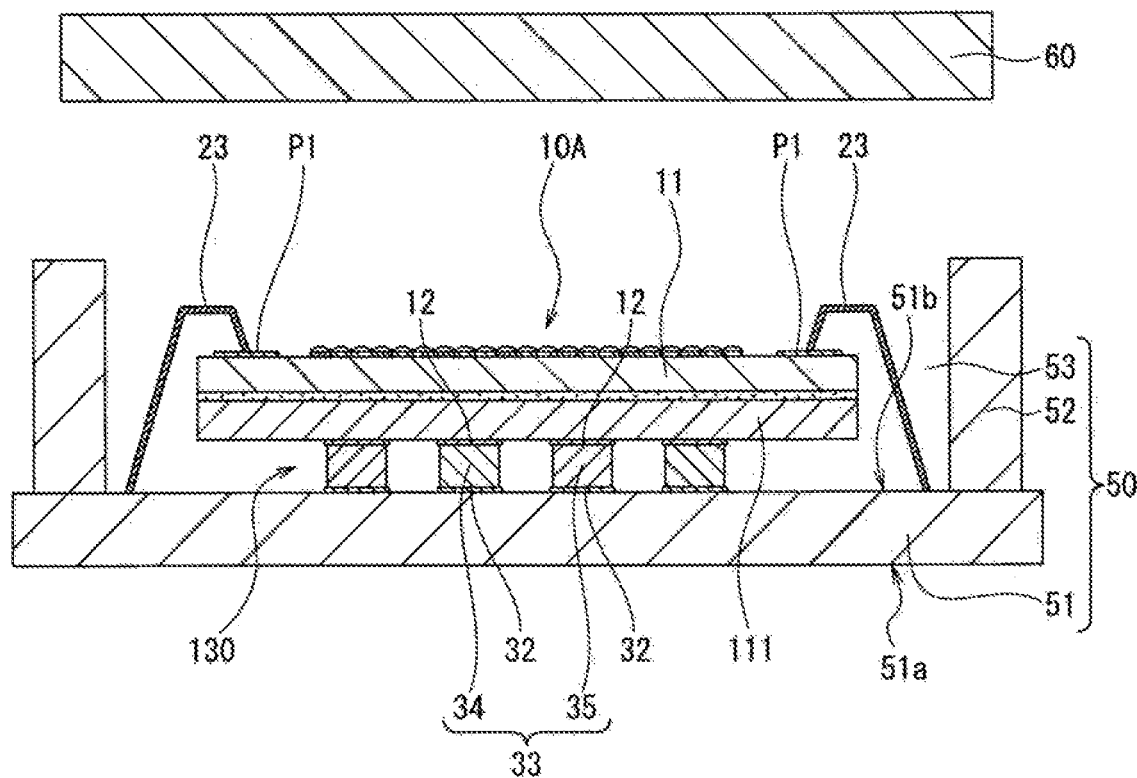
FIG. 24D is a cross-sectional view illustrating, in the order of steps, the method of manufacturing the semiconductor apparatus according to the first variation of the second embodiment of the present disclosure.

Next, as illustrated in FIG. 24D, the manufacturing apparatus, via an adhesive etc., attaches the walls 52A to the top surface 51b side of the bottom 51. Note that, in embodiments of the present disclosure, a wire bonding step may be performed after a step for attaching the walls 52A. Subsequently, the manufacturing apparatus attaches the lid 60 onto the walls 52A of the package body 50, and seals, in an airtight manner, the space 53 between the lid 60 and the package body 50. Through the above steps, the semiconductor apparatus 200A illustrated in FIG. 23 is completed.

(Second Variation)

Figure 25:
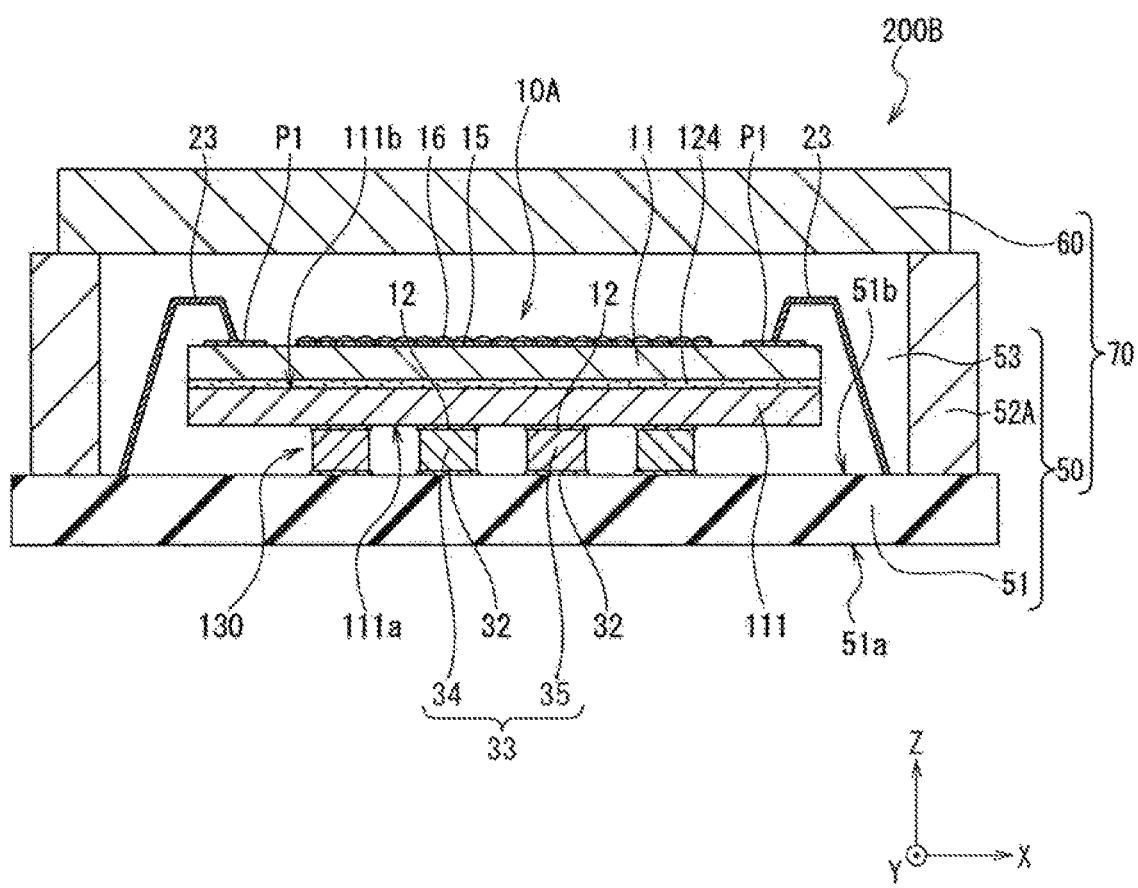
FIG. 25 is a cross-sectional view illustrating a configuration of a semiconductor apparatus according to a second variation of the second embodiment of the present disclosure.

FIG. 25 is a cross-sectional view illustrating a configuration of a semiconductor apparatus 200B according to a second variation of the second embodiment of the present disclosure. In the semiconductor apparatus 200B illustrated in FIG. 25, a package body 50 has a bottom 51A (an example of a "wiring substrate" in the present disclosure) and walls 52A disposed at the perimeter of the bottom 51A. The bottom 51A is a wiring substrate including a material other than ceramic, and, for example, includes an organic substrate including an organic material, a glass substrate, a mold substrate including a mold resin, an LCP substrate including an LCP (liquid crystal polymer), a flexible PI (polyimide) substrate, a rigid FPC (Flexible printed circuits) substrate, etc. Even with such a configuration, the semiconductor apparatus 200B achieves a similar effect to that of the semiconductor apparatus 200A described above.

Third Embodiment

In embodiments of the present disclosure, a semiconductor substrate in which a sensor element or an IC element is formed may serve as an upper substrate for a Peltier element, and a wiring substrate may serve as a lower substrate for the Peltier element. In other words, substrates above and below the Peltier element may serve as other substrates that are not Peltier elements.

Figure 26:
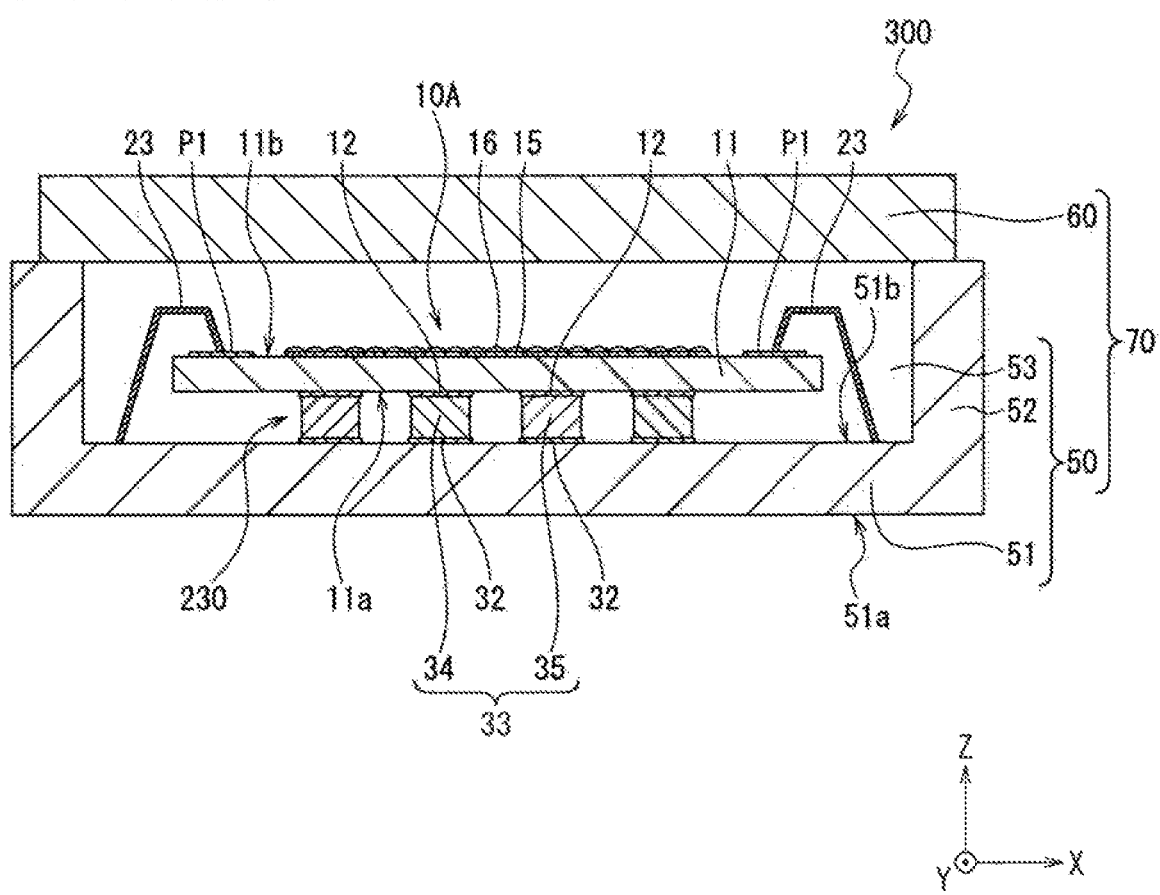
FIG. 26 is a cross-sectional view illustrating an example of a configuration of a semiconductor apparatus according to a third embodiment of the present disclosure.

FIG. 26 is a cross-sectional view illustrating an example of the configuration of a semiconductor apparatus 300 according to a third embodiment of the present disclosure. The semiconductor apparatus 300 illustrated in FIG. 26 is, for example, a sensor apparatus and is provided with a sensor element 10, a Peltier element 230, and a package 70. As described above, the sensor element 10 is a CMOS image sensor or a CCD image sensor, for example.

The Peltier element 230 has a thermoelectric semiconductor 33 disposed between a semiconductor substrate 11 and a bottom 51 (an example of a "wiring substrate" in the present disclosure) of a package body 50. First electrodes 12 are provided on a bottom surface 11a side of the semiconductor substrate 11. Second electrodes 32 are provided on a top surface 51b side of the bottom 51 of the package body 50. The first electrodes 12 and the second electrodes 32 are each connected to the thermoelectric semiconductor 33.

As a result, the semiconductor substrate 11 can also serve as an upper substrate for the Peltier element 230, and the bottom 51 of the package body 50 can also serve as a lower substrate for the Peltier element 230. It is possible to integrate the Peltier element 230 with the semiconductor substrate 11 and the bottom 51, and it is possible to reduce the number of components for the semiconductor apparatus 300. As a result, it is possible to reduce the thickness (reduce the profile) of the semiconductor apparatus 300, and it is possible to miniaturize the semiconductor apparatus 300.

In addition, by integrating the semiconductor substrate 11, the Peltier element 230, and the bottom 51, heat exhaust efficiency from the semiconductor substrate 11 to the bottom 51 improves. Because there is no substrate (upper substrate) for supporting the thermoelectric semiconductor 33 between the semiconductor substrate 11 and the Peltier element 30, heat exhaust from the semiconductor substrate 11 to the Peltier element 230 is performed with good efficiency. In addition, because there is no substrate (lower substrate) for supporting the thermoelectric semiconductor 33 between Peltier element 130 and the bottom 51, heat exhaust from the Peltier element 230 to the bottom 51 is performed with good efficiency. As a result, the Peltier element 230 can improve cooling performance with respect to the semiconductor substrate 11.

In addition, similarly to with the semiconductor apparatuses 100 and 200, the semiconductor apparatus 300 achieves various effects such as miniaturization due to not needing dedicated Peltier element lead-out wiring, lowering costs due to reduction of the number of components, and suppression of warping of the semiconductor substrate 11 due to improved heat exhaust performance.

(Variation)

Figure 27:
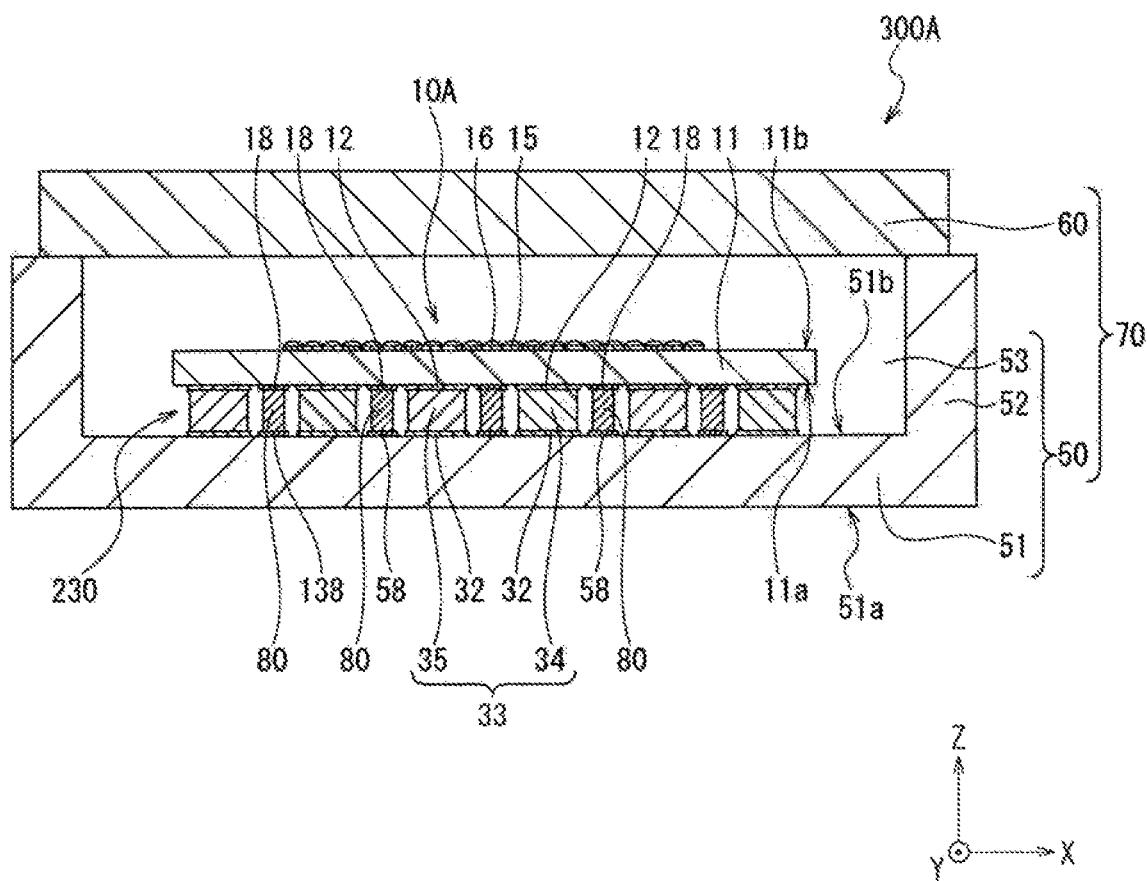
FIG. 27 is a cross-sectional view illustrating a configuration of a semiconductor apparatus according to a variation of the third embodiment of the present disclosure.

FIG. 27 is a cross-sectional view illustrating a configuration of a semiconductor apparatus 300A according to a variation of the third embodiment of the present disclosure. As illustrated in FIG. 27, the semiconductor apparatus 300A is provided with electrical conductors 80, which are disposed between the P-type thermoelectric semiconductors 34 and the N-type thermoelectric semiconductors 35 and are each electrically separated from the P-type thermoelectric semiconductors 34 and the N-type thermoelectric semiconductors 35.

The electrical conductors 80 are connecting terminals for connecting electrodes 18 provided on the bottom surface side of the semiconductor substrate 11, with electrodes 58 provided on a bottom 51 of a package body 50. The electrodes 18 are provided at positions separated from the first electrodes 12, and are electrically separated from the first electrodes 12. The electrodes 58 are provided at positions separated from the second electrodes 32, and are electrically separated from the second electrodes 32. The electrical conductors 80 are connected, via the electrodes 18 and 58, to the semiconductor substrate 11 and the bottom 51 of the package body 50.

In the semiconductor apparatus 300A, the electrical conductors 80 are used as signal lines or power supply lines between the semiconductor substrate 11 and the bottom 51.

The electrical conductors 80 are connected between the semiconductor substrate 11 and the bottom 51 without bypassing the Peltier element 230. The semiconductor apparatus 300A enables the length of wiring between the semiconductor substrate 11 and the bottom 51 to be shortened, and thus enables a reduction of impedance.

Note that, in the semiconductor apparatus 300A, an insulating resin (not illustrated) may be filled between the semiconductor substrate 11 and the bottom 51. Because the electrical conductors 80 are supported in the horizontal direction (direction parallel to the X-Y plane) by the resin between the semiconductor substrate 11 and the bottom 51, the joint strength of the electrical conductors 80 with respect to the semiconductor substrate 11 and the bottom 51 improves.

Other Embodiments

As described above, the present disclosure is described by the embodiments and the variations, but statements and drawings that form a portion of this disclosure should not be understood as limiting the present disclosure. From the present disclosure, various alternative embodiments, examples, and operational techniques will become apparent to a person skilled in the art. Needless to say, the present technique includes, for example, various embodiments not described here. At least one of various omissions, replacements, and changes to components can be performed within a scope that does not depart from the substance of the embodiments and variations described above. In addition, effects described in the present specification are only examples, there is no limitation thereto, and there may be other effects.

Note that the present disclosure can have the following configurations.

(1)

A semiconductor apparatus including:
a semiconductor substrate; and
a Peltier element disposed facing the semiconductor substrate, in which
the Peltier element has
a first substrate, and
a thermoelectric semiconductor disposed between the first substrate and the semiconductor substrate,
the semiconductor substrate has a first electrode provided on a surface side facing the first substrate,
the first substrate has a second electrode provided on a surface side facing the semiconductor substrate, and
the first electrode and the second electrode are each connected to the thermoelectric semiconductor.

(2)

A semiconductor apparatus including:
a semiconductor substrate;
a wiring substrate facing the semiconductor substrate; and
a Peltier element disposed between the semiconductor substrate and the wiring substrate, in which
the Peltier element has
a second substrate, and
a thermoelectric semiconductor disposed between the wiring substrate and the second substrate,
the second substrate has a first electrode provided on a surface side facing the wiring substrate,
the wiring substrate has a second electrode provided on a surface side facing the second substrate, and
the first electrode and the second electrode are each connected to the thermoelectric semiconductor.

(3)
A semiconductor apparatus including:
a semiconductor substrate;
a wiring substrate facing the semiconductor substrate; and
a Peltier element disposed between the semiconductor substrate and the wiring substrate, in which
the Peltier element has
a thermoelectric semiconductor disposed between the semiconductor substrate and the wiring substrate,
the semiconductor substrate has a first electrode provided on a surface side facing the wiring substrate,
the wiring substrate has a second electrode provided on a surface side facing the semiconductor substrate, and
the first electrode and the second electrode are each connected to the thermoelectric semiconductor.

(4)
The semiconductor apparatus according to (1) or (3), further including:
a first through electrode that penetrates the semiconductor substrate in a thickness direction, in which
the first through electrode is connected to the first electrode.

(5)
The semiconductor apparatus according to any one of (1) to (4), further including:
a package that accommodates and seals, in an airtight manner, the semiconductor substrate and the Peltier element.

(6)
The semiconductor apparatus according to (1), further including:
a first rewiring layer provided in the semiconductor substrate on a reverse side of a surface facing the first substrate.

(7)
The semiconductor apparatus according to (1), further including:
a second rewiring layer provided in the first substrate on a reverse side of a surface facing the semiconductor substrate.

(8)
The semiconductor apparatus according to any one of (1) to (7), in which
the thermoelectric semiconductor has
a plurality of first thermoelectric semiconductors, and
a plurality of second thermoelectric semiconductors having an electrical conductivity type different from that of the first thermoelectric semiconductors, and
the first thermoelectric semiconductors and the second thermoelectric semiconductors are alternatingly connected in series via the first electrode and the second electrode.

(9)
The semiconductor apparatus according to (8), further including:
an electrical conductor disposed adjacent to the first thermoelectric semiconductors and the second thermoelectric semiconductors with respective intervals.

(10)
The semiconductor apparatus according to (8) or (9), further including:
an insulating resin filled between the first thermoelectric semiconductor and the second thermoelectric semiconductor.

Furthermore, the present disclosure can have the following configurations.

(11)
A semiconductor apparatus including:
a semiconductor substrate; and
a Peltier element disposed on one surface side of the semiconductor substrate, in which
the Peltier element has
a thermoelectric semiconductor, and
a first substrate disposed sandwiching the thermoelectric semiconductor on a reverse side of the semiconductor substrate, and
the semiconductor substrate also serves as a second substrate for sandwiching and supporting the thermoelectric semiconductor with the first substrate.

(12)
A semiconductor apparatus including:
a semiconductor substrate;
a wiring substrate facing the semiconductor substrate; and
a Peltier element disposed between the semiconductor substrate and the wiring substrate, in which
the Peltier element has
a thermoelectric semiconductor, and
a second substrate disposed sandwiching the thermoelectric semiconductor on a reverse side of the wiring substrate, and
the wiring substrate also serves as a first substrate for sandwiching and supporting the thermoelectric semiconductor with the second substrate.

(13)
A semiconductor apparatus including:
a semiconductor substrate;
a wiring substrate facing the semiconductor substrate; and
a Peltier element disposed between the semiconductor substrate and the wiring substrate, in which
the Peltier element has
a thermoelectric semiconductor, and
the wiring substrate also serves as a first substrate from among a pair of substrates which sandwich and support the thermoelectric semiconductor from both sides, and
the semiconductor substrate also serves as a second substrate from among the pair of substrates.

REFERENCE SIGNS LIST

10: Sensor element
10': Sensor wafer
10A: IC element
11: Semiconductor substrate
11a, 31a, 51a, 111a: Bottom surface
11b, 31b, 51b, 111b: Top surface
12: First electrode
13, 38, 138: Wiring
14: External connection terminal
15: Color filter layer
16: Micro-lens layer
18, 58: Electrode
21: Support substrate
22, 36: Through electrode
23, 123: Wire
24, 124: Die bond material
25: First spacer
26: Through wiring
30, 30A, 130, 230: Peltier element
31: Lower substrate
32: Second electrode
33: Thermoelectric semiconductor 34: P-type thermoelectric semiconductor
35: N-type thermoelectric semiconductor
37, 137: Rewiring layer
39, 139: Insulation layer
40, 140: Bump electrode
45: Second spacer
50: Package body
50A: Package body
51, 51A: Bottom
52, 52A: Wall
53: Space
60: Lid
61: Resin
70: Package
80: Electrical conductor
100, 100A to 100K, 200A, 200B, 300, 300A: Semiconductor apparatus
111: Upper substrate
AR1: Pixel region
AR2: Region in which thermoelectric semiconductor is disposed
AR3: Peripheral region
H1: Through hole
P1, P2: Bonding pad

The invention claimed is:

1. A semiconductor apparatus, comprising:
a semiconductor substrate;
a Peltier element that faces the semiconductor substrate, wherein the Peltier element includes
a first substrate, and
a thermoelectric semiconductor between the first substrate and the semiconductor substrate,
a first electrode directly on a surface side of the semiconductor substrate that faces the first substrate; and
a second electrode on a surface side of the first substrate that faces the semiconductor substrate, wherein each of the first electrode and the second electrode are connected to the thermoelectric semiconductor.

2. The semiconductor apparatus according to claim 1, further comprising a first through electrode that penetrates the semiconductor substrate in a thickness direction, wherein the first through electrode is connected to the first electrode.

3. The semiconductor apparatus according to claim 1, further comprising a package that accommodates and seals, in an airtight manner, the semiconductor substrate and the Peltier element.

4. The semiconductor apparatus according to claim 1, further comprising a first rewiring layer in the semiconductor substrate, wherein the first rewiring layer is on an opposite side of the surface side that faces the first substrate.

5. The semiconductor apparatus according to claim 1, further comprising a second rewiring layer in the first substrate, wherein the second rewiring layer is on an opposite side of the surface side that faces the semiconductor substrate.

6. The semiconductor apparatus according to claim 1, wherein
the thermoelectric semiconductor includes
a plurality of first thermoelectric semiconductors that have a first electrical conductivity type, and
a plurality of second thermoelectric semiconductors that have a second electrical conductivity type, wherein the first electrical conductivity type is different from the second electrical conductivity type, and
the first thermoelectric semiconductors and the second thermoelectric semiconductors are alternatingly connected in series via the first electrode and the second electrode.

7. The semiconductor apparatus according to claim 6, further comprising an electrical conductor adjacent to the first thermoelectric semiconductors and the second thermoelectric semiconductors with respective intervals.

8. The semiconductor apparatus according to claim 6, further comprising an insulating resin between the first thermoelectric semiconductors and the second thermoelectric semiconductors.

9. The semiconductor apparatus according to claim 6, further comprising electrical conductors between the first thermoelectric semiconductors and the second thermoelectric semiconductors with respective intervals, wherein each of the electrical conductors are electrically separated from the first thermoelectric semiconductors and the second thermoelectric semiconductors.

* * * * *